(12) United States Patent
Dunn et al.

(10) Patent No.: US 8,950,265 B2
(45) Date of Patent: Feb. 10, 2015

(54) ELECTROACTIVE POLYMER BASED PRESSURE SENSOR

(71) Applicant: Parker-Hannifin Corporation, Cleveland, OH (US)

(72) Inventors: Jason T. Dunn, Minneapolis, MN (US); Shawn D. Ellis, Golden Valley, MN (US); Roger W. Briese, Minneapolis, MN (US); Tad N. Orstad, Elk River, MN (US); Todd D. Lambert, Brooklyn Park, MN (US); John E. Page, Greenfield, MN (US); Mario A. Calvo, Minneapolis, MN (US); Timothy Skwiot, Winona, MN (US)

(73) Assignee: Parker-Hannifin Corporation, Cleveland, OH (US)

(*) Notice: Subject to any disclaimer, the term of this patent is extended or adjusted under 35 U.S.C. 154(b) by 84 days.

(21) Appl. No.: 13/726,745

(22) Filed: Dec. 26, 2012

(65) Prior Publication Data

US 2013/0248024 A1    Sep. 26, 2013

Related U.S. Application Data

(60) Provisional application No. 61/604,786, filed on Feb. 29, 2012, provisional application No. 61/581,237, filed on Dec. 29, 2011.

(51) Int. Cl.
| | |
|---|---|
| *G01L 7/00* | (2006.01) |
| *H01L 41/113* | (2006.01) |
| *G01L 9/12* | (2006.01) |
| *G01L 9/00* | (2006.01) |
| *G01L 19/00* | (2006.01) |
| *G01L 19/04* | (2006.01) |
| *G01L 19/06* | (2006.01) |
| *G01L 19/14* | (2006.01) |
| *H01L 41/09* | (2006.01) |

(52) U.S. Cl.
CPC ............. *H01L 41/1132* (2013.01); *G01L 7/00* (2013.01); *G01L 9/12* (2013.01); *G01L 9/0072* (2013.01); *G01L 19/0007* (2013.01); *G01L 19/0084* (2013.01); *G01L 19/04* (2013.01); *G01L 19/0645* (2013.01); *G01L 19/142* (2013.01); *G01L 19/148* (2013.01); *H01L 41/0966* (2013.01)
USPC .................................. 73/714; 73/718; 73/724

(58) Field of Classification Search
None
See application file for complete search history.

(56) References Cited

U.S. PATENT DOCUMENTS

| | | | | |
|---|---|---|---|---|
| 6,969,941 | B1* | 11/2005 | Kapps et al. | 310/316.01 |
| 2006/0208610 | A1* | 9/2006 | Heim | 310/311 |
| 2007/0200466 | A1* | 8/2007 | Heim | 310/800 |
| 2009/0001855 | A1* | 1/2009 | Lipton et al. | 310/331 |
| 2010/0205803 | A1* | 8/2010 | Lipton et al. | 29/825 |
| 2010/0231091 | A1* | 9/2010 | Heim | 310/328 |
| 2011/0169742 | A1* | 7/2011 | Lipton et al. | 345/168 |
| 2013/0207793 | A1* | 8/2013 | Weaber et al. | 340/407.2 |
| 2014/0035735 | A1* | 2/2014 | Zellers et al. | 340/407.2 |
| 2014/0232646 | A1* | 8/2014 | Biggs et al. | 345/156 |

* cited by examiner

*Primary Examiner* — Andre Allen
(74) *Attorney, Agent, or Firm* — Renner, Otto, Boisselle & Sklar, LLP.

(57) ABSTRACT

A sensor including a buffer material layer configured to at least partially deflect when a force or pressure is imparted on the buffer material layer; and an electroactive polymer (EAP) cartridge in operative contact with the buffer material layer, wherein the EAP cartridge is configured to generate an output signal that corresponds to an amount of strain imparted on the EAP cartridge. The EAP cartridge may be used in a variety of sensing applications including as a pressure sensor integrated into a fluid connector. One aspect of the invention provides for selection of a buffer material layer based upon a desired pressure range.

27 Claims, 25 Drawing Sheets

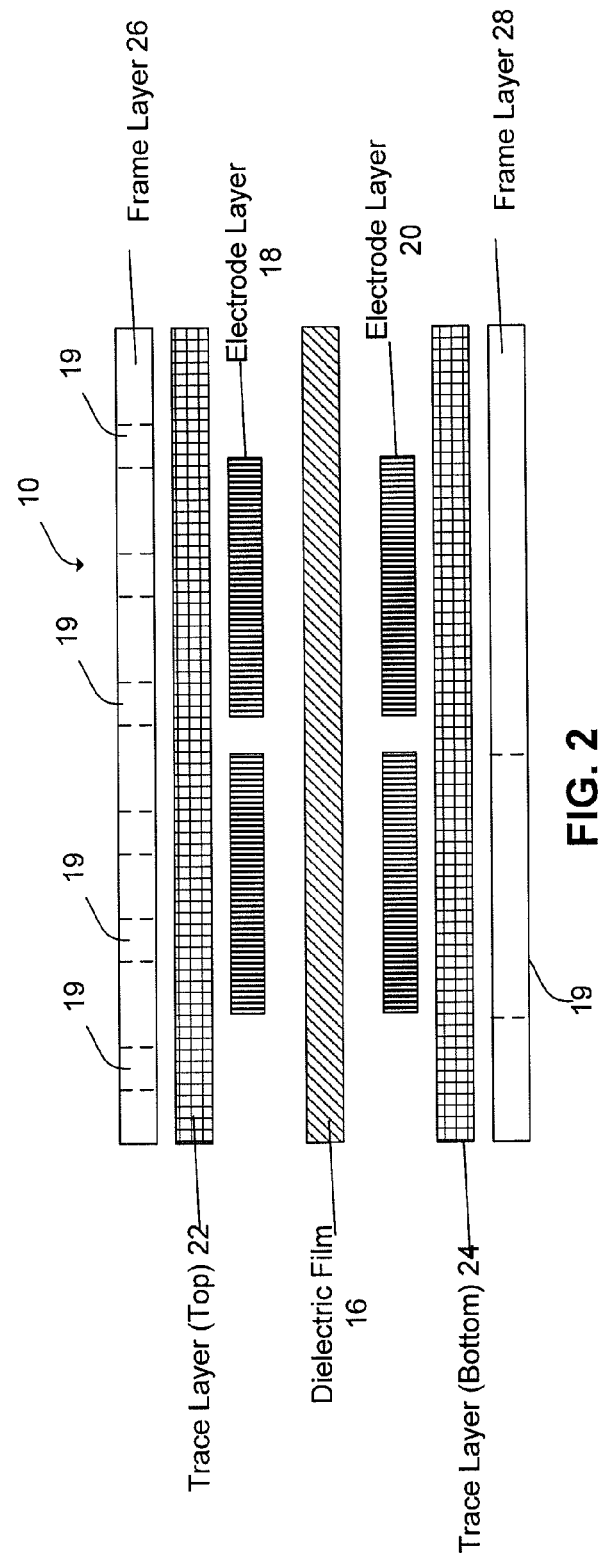

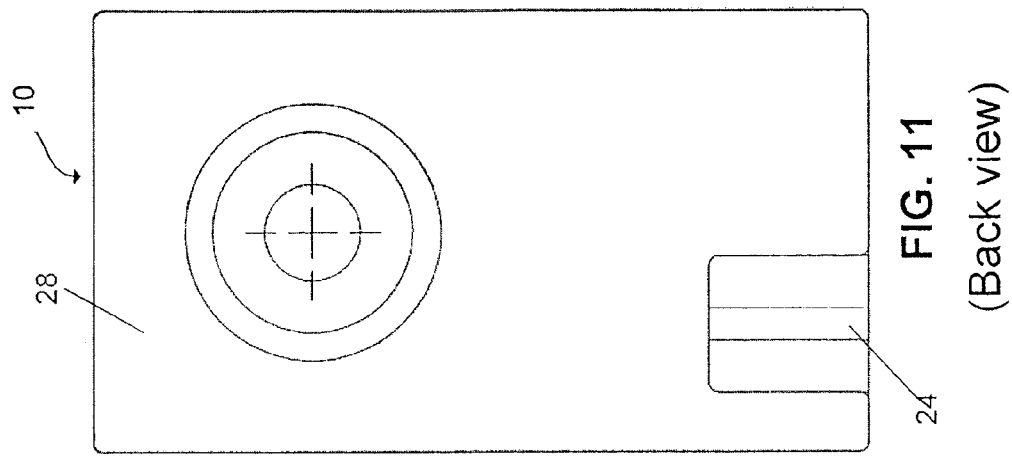
FIG. 11 (Back view)
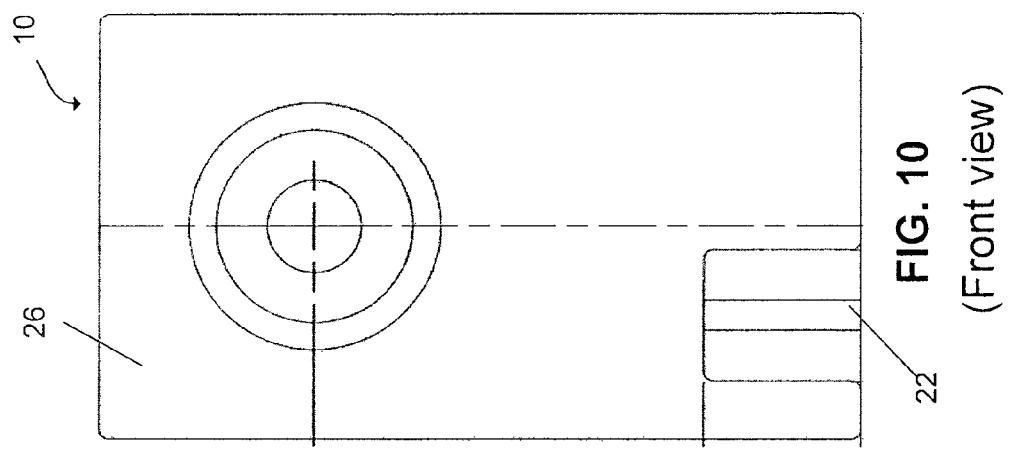
FIG. 10 (Front view)
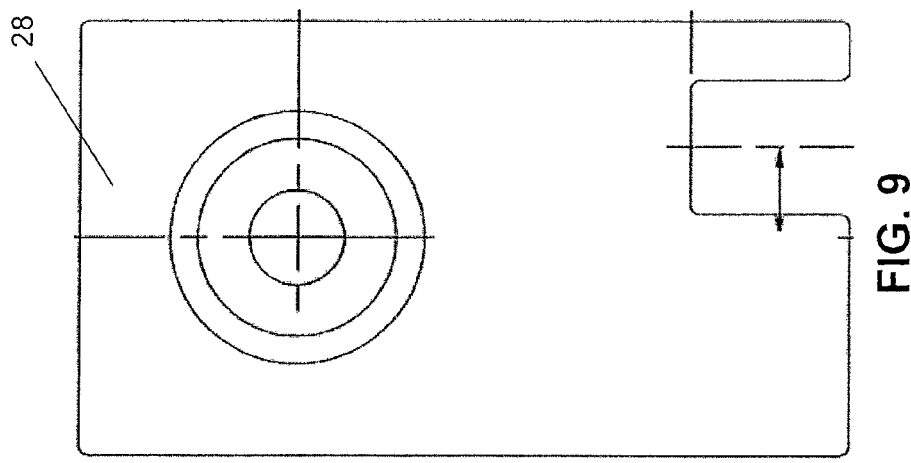
FIG. 9

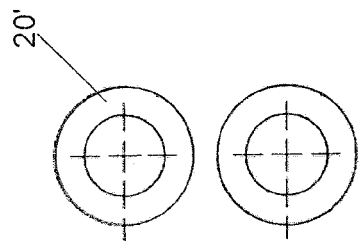
FIG. 15
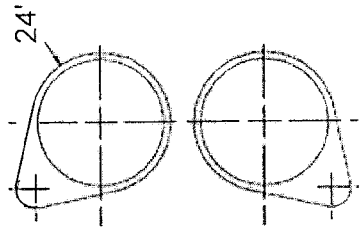
FIG. 17
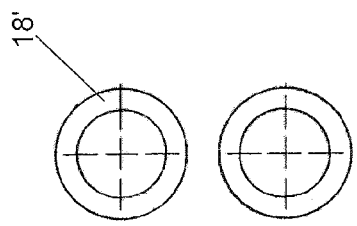
FIG. 16
FIG. 18
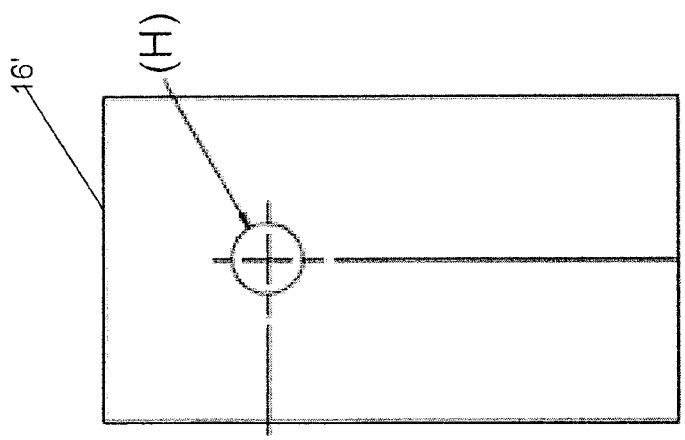
FIG. 14

(Back View)

(Front View)

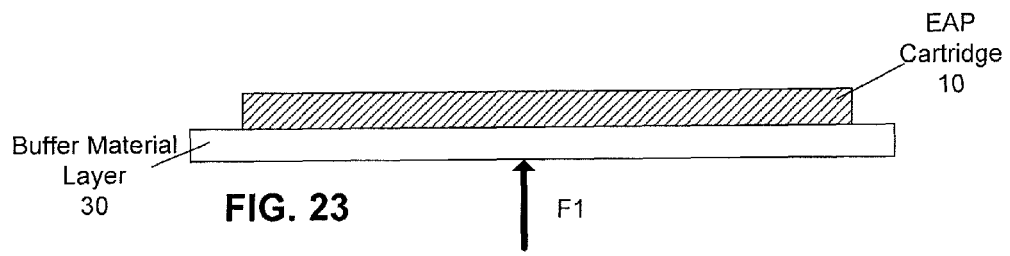
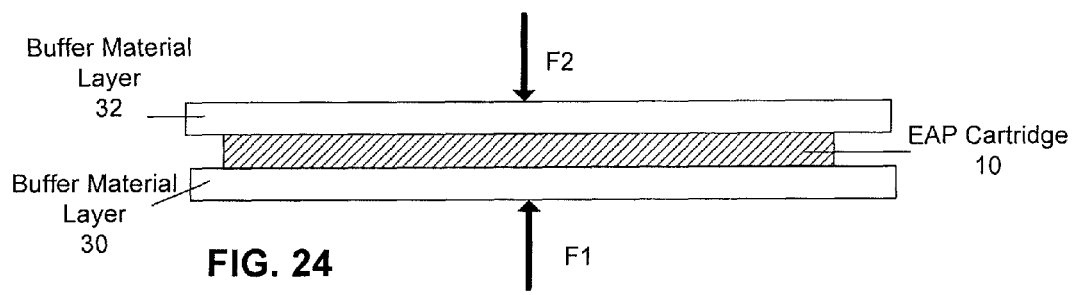
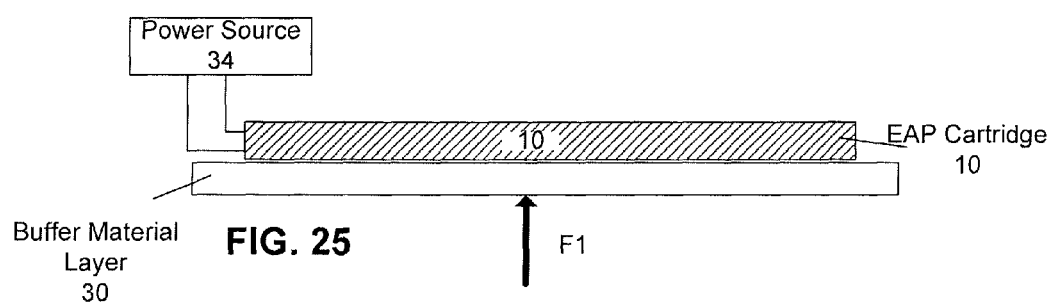
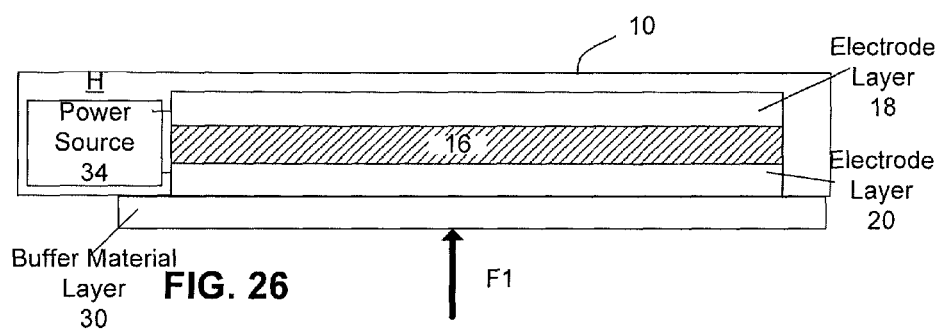

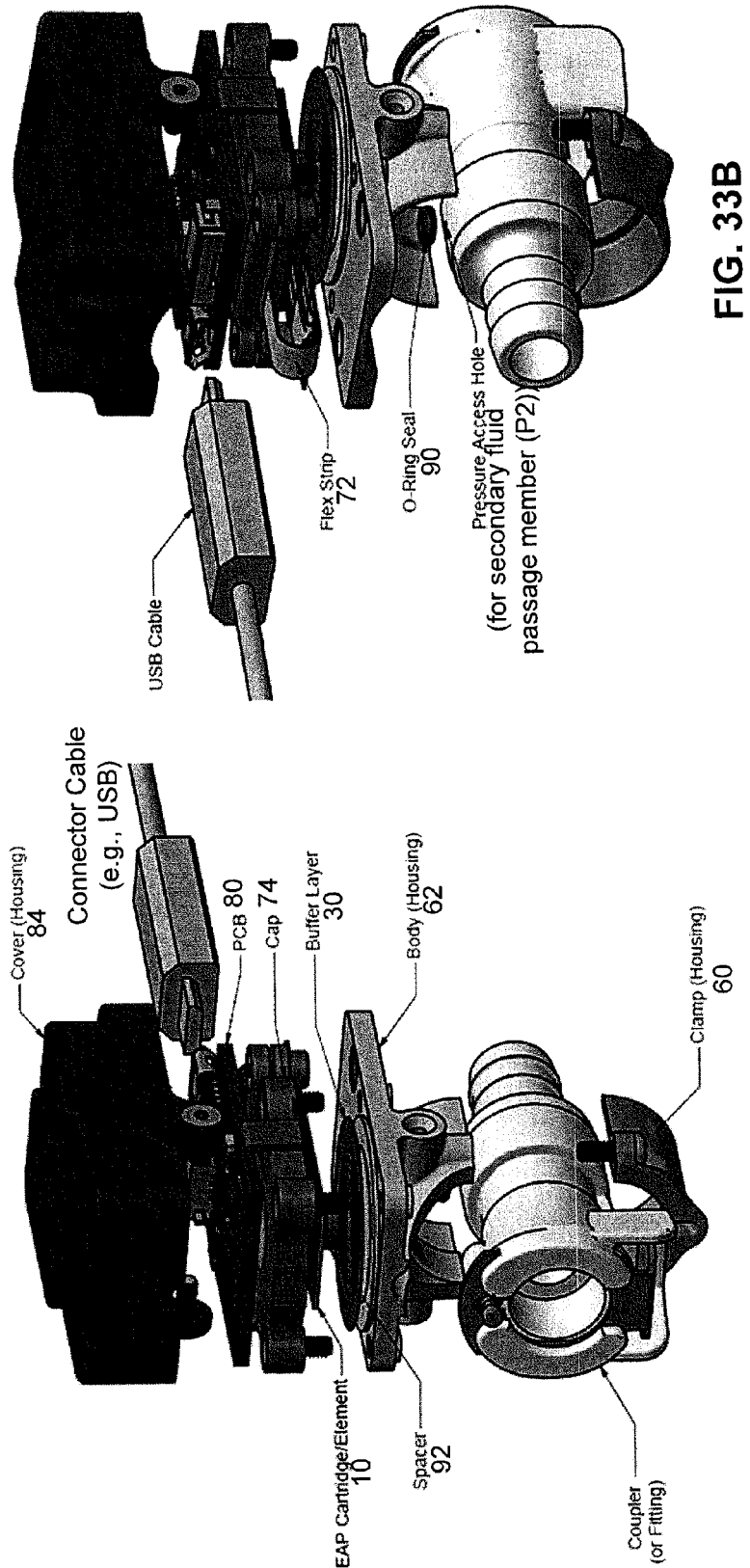

ELECTROACTIVE POLYMER BASED PRESSURE SENSOR

RELATED APPLICATION DATA

This application claims priority of U.S. Provisional Application No. 61/604,786 filed on Feb. 29, 2012 and U.S. Provisional Application No. 61/581,237 filed on Dec. 29, 2011, both of which are incorporated herein by reference.

TECHNICAL FIELD

The present invention relates to a pressure sensor housed within a fluid connector and a method of manufacturing the pressure sensor. The sensor may include an electroactive polymer (EAP) material as the primary sensing element.

BACKGROUND

It is common in fluid systems to desire knowledge of the pressure of the fluid flowing through the system for maintaining system operating parameters within an acceptable range, detecting fluid leaks, detecting malfunctioning of products due to an abrupt pressure change, etc. Currently, many fluidic and pneumatic systems do not incorporate any local pressure measurement due to the relatively high expense and complexity of commercially available pressure sensors.

SUMMARY

Aspects of the present invention is to provide an electroactive polymer material as a pressure sensing element and the integral use of an electroactive polymer material as the pressure sensing element within a fluidic or pneumatic fitting/connector.

One aspect of the invention relates to a sensor including: a buffer material layer configured to at least partially deflect when a force and/or pressure is imparted on the buffer material layer; and an electroactive polymer (EAP) cartridge in operative contact with the buffer material layer, wherein the EAP cartridge is configured to generate an output signal that corresponds to an amount of strain imparted on the EAP cartridge.

Another aspect of the invention relates to a method for measuring fluidic pressure in a fluid connector, the method including: positioning a buffer material layer in fluid communication between an inlet port and an outlet port of a fluid connector, wherein the fluid connector includes a primary fluid passageway for fluid transfer between the inlet port and an outlet port and the buffer material layer is configured to at least partially deflect when a force or pressure is imparted on the buffer material layer; and sensing deflection of the buffer material lay by an electroactive polymer (EAP) cartridge in operative contact with the buffer material layer, wherein the EAP cartridge is configured to generate an output signal that corresponds to an amount of strain imparted on the EAP cartridge from deflection of the buffer material layer.

Another aspect of the invention relates to a fluid connector including: a body having a primary fluid passageway defined between an inlet port and an outlet port; a buffer material layer configured to at least partially deflect when a force or pressure is imparted on the buffer material layer by fluid entering the primary fluid passageway; and an electroactive polymer (EAP) cartridge in operative contact with the buffer material layer, wherein the EAP cartridge is configured to generate an output signal that corresponds to an amount of strain imparted on the EAP cartridge by the deflection of the buffer material layer on the EAP cartridge.

Another aspect of the invention relates to a fluid connector including: a body having a primary fluid passageway defined between an inlet port and an outlet port; a sensor configured to at least partially deflect when a force and/or pressure is imparted on the sensor by fluid entering the primary passageway; and the sensor is configured to generate an output signal that corresponds to an amount of force and/or pressure detected by the sensor.

Another aspect of the invention relates to a sensor including: a dielectric layer having a first array of electrodes on a first surface and a second array of electrodes on an opposing second surface, wherein the first array of electrodes and the second array of electrodes are at least partially aligned about an axis; a first planar member having a first void formed between opposing surfaces of the first planar member and a first conductive trace formed around the void on a first side of the first planar member, and a second conductive trace formed on the first side of the planar member, wherein the first conductive trace is configured to contact one of the first array of electrodes on the dielectric layer and the second conductive trace is configured to contact another one of the first array of electrodes; a second planar member having a second void formed between opposing surfaces of the second planar member and a third conductive trace formed around the second void on a first side of the second planar member and a fourth conductive trace formed on the first side of the second planar member, wherein the third conductive trace is configured to contact one of the first array of electrodes on the dielectric layer and the fourth conductive trace is configured to contact another one of the first array of electrodes; a first adhesive layer configured to secure the first planar member to the dielectric layer; and a second adhesive layer configured to secure the second planar member to the dielectric layer.

Another aspect of the invention relates to a fluid sensor including: a body having a primary fluid passageway defined between an inlet port and an outlet port; a buffer material layer configured to at least partially deflect when a force or pressure is imparted on the buffer material layer, wherein the buffer material layer is in fluid communication with the primary fluid passageway; and any of the sensors listed above in operative contact with the buffer material layer, wherein an active region sensor is configured to generate an output signal that corresponds to an amount of strain imparted on the sensor.

Another aspect of the invention relates to a method of assembling a web of sensing elements, the method including: applying a first array of electrodes on a first surface of a web of dielectric layer; applying a second array of electrodes on a second surface of the dielectric layer, wherein the first surface and the second surface are opposing surfaces of the dielectric layer and the first array of electrodes and the second array of electrodes and the first array of electrodes and the second array of electrodes are at least partially aligned about an axis; forming an array of voids in a web of first planar members and applying a first conductive trace around each of the voids on one surface of the web of first planar members, and applying a second conductive trace on the one surface of the web of first planar members at a prescribed distance from the first conductive trace, wherein the first conductive trace is configured to make contact with one of the first array of electrodes; forming a second array of voids in a web of second planar members and applying a second conductive trace around each of the second voids on one surface of the web of second planar member, and applying a second conductive trace on the one surface of the web of the second planar member at the prescribed distance from the second conductive trace, wherein the first conductive trace is configured to make contact with one of the second array of electrodes; applying adhesive to at least one of the first surface of the dielectric layer and the one surface of the first planar member; applying adhesive to at least one of the second surface of the dielectric layer and the one surface of the second planar member; applying a force to the dielectric layer between the first planar member and the second planar member to form a web of sensing elements.

Another aspect of the invention relates to a sensor including: a first electroactive polymer (EAP) assembly; a second EAP assembly; an insulative layer coupled between the first EAP assembly and the second EAP assembly, wherein the first EAP assembly and the second EAP assembly are each configured to generate an output signal that corresponds to an amount of strain imparted on each of the respective assemblies.

Another aspect of the invention relates to the integration of a pressure sensor into a quick disconnect coupler, regardless of how the pressure is sensed.

Other systems, devices, methods, features, and advantages of the present invention will be or become apparent to one having ordinary skill in the art upon examination of the following drawings and detailed description. It is intended that all such additional systems, methods, features, and advantages be included within this description, be within the scope of the present invention, and be protected by the accompanying claims.

It should be emphasized that the term "comprise/comprising" when used in this specification is taken to specify the presence of stated features, integers, steps or components but does not preclude the presence or addition of one or more other features, integers, steps, components or groups thereof."

BRIEF DESCRIPTION OF THE DRAWINGS

Embodiments of this invention will now be described in further detail with reference to the accompanying drawings, in which:

FIGS. 1-11 illustrate various material layers to form an exemplary electroactive polymer (EAP) cartridge in accordance with aspects of the present invention.

FIGS. 12-22 illustrate various material layers of another embodiment of an exemplary EAP cartridge in accordance with aspects of the present invention.

FIGS. 23-26 illustrate applications of the EAP cartridge and a buffer material layer in accordance with aspects of the present invention.

FIGS. 27-32 and 33A-33C are exemplary fluid connectors in accordance with aspects of the present invention.

DETAILED DESCRIPTION OF EMBODIMENTS

Aspects of the present invention relate to a pressure sensor housed or integrated in a fluid connector. The present invention is directed to any type of sensor capable of being housed within a fluid connector. For purposes of this disclosure, the sensing element will be described as an electroactive polymer (EAP) cartridge that functions to detect an applied physical characteristic, such as deflection, force and/or pressure. The sensing element may also include other technologies (e.g., linear variable displacement transducers, linear variable differential transducers, piezoelectric materials, piezoresistive materials, etc.).

In one embodiment, the sensing element is an EAP cartridge that is integrated within a fluidic or pneumatic fitting and/or connector for use as a pressure sensor. For purposes of this disclosure the term "fluidic" means a continuous, amorphous substance whose molecules move freely past one another and that has the tendency to assume the shape of its container. A fluid may be a liquid or a gas. The terms "fitting" and "connector" and "coupler" may be used interchangeably and generally refer to coupling with a device and/or a component, for example.

Figure 1:

Referring to FIG. 1, an exemplary EAP cartridge 10 is illustrated. As described below, the EAP cartridge 10 includes a plurality of layers to form an active (sensing) region 12 and a reference region 14. The active region 12 is configured to sense at least one of deflection, force, and/or pressure applied to the region 12. The size and shape of the EAP cartridge 10 may vary depending on design considerations, applications and environments in which the cartridge may be used, etc. Any size and shape of the EAP cartridge 10 shall be deemed to fall within the scope of the present invention. Likewise, the size and shape of the active region 12 and/or the reference region 14 may be any desirable size and shape. Preferably, deflection, force and/or pressure applied to the active region 12 do not impart movement and/or a force to the reference region 14. In some cases, it may be desirable for the active region 12 to be circular, which generally reduces local stresses in the EAP cartridge 10. In addition, it is desirable that the active region 12 and the reference region 14 be mechanically isolated from each other (e.g., strain relief between the active and reference regions).

Referring to FIG. 2, a cross-section of an exemplary EAP cartridge 10 in accordance with aspects of the present invention is illustrated. The EAP cartridge 10 includes a dielectric layer 16 that separates a first electrode layer 18 and a second electrode layer 20, also referred to herein as a pair of electrodes. When a voltage is applied to the electrode layers 18, 20, the dielectric layer 16 and the electrodes layers 18, 20 form a capacitor that varies in capacitance based on stress (e.g., stretching of the EAP material) applied to the dielectric layer 16. The output capacitance and/or resistance may be correlated to strain applied to the material. For example, the dielectric layer 16 is configured to change thickness and surface area based on an amount of force and/or pressure applied to the dielectric layer 16, which changes the output capacitance of the capacitor formed by the dielectric layer 16 and the electrode layers 18, 20.

Materials suitable for use as a dielectric layer 16 may include any substantially insulating polymer or rubber (or combination thereof) that deforms in response to an electrostatic force or whose deformation results in a change in electric field. Exemplary materials suitable for use as a pre-strained polymer include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. The thickness of the dielectric layer 16 may be any desired thickness. In one embodiment, a thickness of less than 75 microns is desirable.

As the dielectric layer 16 may deflect at high strains, electrode layers 18, 20 attached and/or adjacent the dielectric layer 16 should also deflect without compromising mechanical or electrical performance. Generally, electrode layers 18, 20 suitable for use may be of any shape and material provided that they are able to supply a suitable voltage to, or receive a suitable voltage from, the dielectric layer 16. In one embodiment, the electrode layers 18, 20 are manufactured from a compliant conductive material (e.g., carbon ink). In an alternative embodiment, in lieu of printed electrodes on the EAP cartridge, conductive buffer layers may be used on one or both sides of the cartridge 10.

The electrode layers are aligned with each other to essentially form parallel capacitive plates. The voltage may be either constant or varying over time. In one embodiment, the electrodes adhere to a surface of the polymer. Electrodes adhering to the polymer are preferably compliant and conform to the changing shape of the polymer. Correspondingly, the present disclosure may include compliant electrodes that conform to the shape of an electroactive polymer to which they are attached. The electrodes may be only applied to a portion of the dielectric layer 16 and define an active area according to their geometry. The electrode layers may also be utilized to form the reference region 14. The reference region 14 is generally non-active and is preferably mechanically isolated from the active region 12 and/or there is strain relief between the active region 12 and the reference region 14. Various types of electrodes suitable for use with the present disclosure include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present disclosure may vary. Suitable materials used in an electrode may include graphite, carbon black, colloidal suspensions, thin metals including silver and gold, silver filled and carbon filled gels and polymers, and ionically or electronically conductive polymers. It is understood that certain electrode materials may work well with particular polymers and may not work as well for others. By way of example, carbon fibrils work well with acrylic elastomer polymers while not as well with silicone polymers. In one embodiment, the electrode layers are formed by carbon ink applied to opposing sides of the dielectric layer 16 to form parallel capacitive plates. Application of the electrodes may take any form including, for example, printing, etching, etc.

The EAP cartridge 10 may further include trace layers 22, 24. The trace layers 22, 24 may be applied to each side of the cartridge 10, as illustrated in FIG. 2. In one embodiment, the trace layers 22, 24 may be made from a highly conductive material (e.g., silver to form a silver buss). Other conductive materials may also be suitable. The trace layers 22, 24 provide for capacitive charge distribution as well as reducing series resistance, which improves response time and increases accuracy.

The EAP cartridge 10 may further include framer layers 26, 28. The frame layers 26, 28 may be applied to each side of the cartridge 10, as illustrated in FIG. 2. The frame layers 26 provide for the EAP cartridge 10 to be handled, along with maintaining a pre-stretch of the EAP dielectric film. Suitable materials for the frame layers 26 may include a variety of curable epoxies or any other non-conductive, rigid material that will adhere to the dielectric film.

Figure 5:
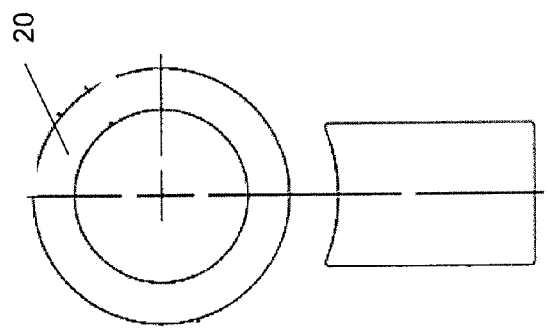
Figure 4:
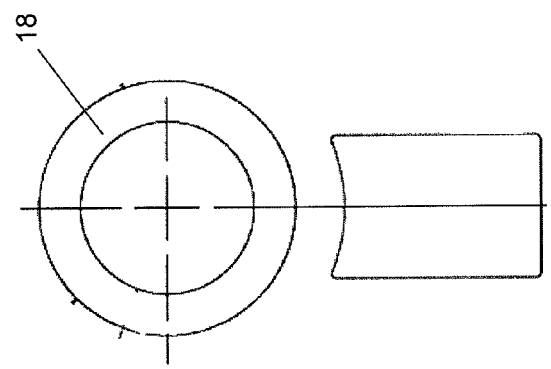
Figure 3:
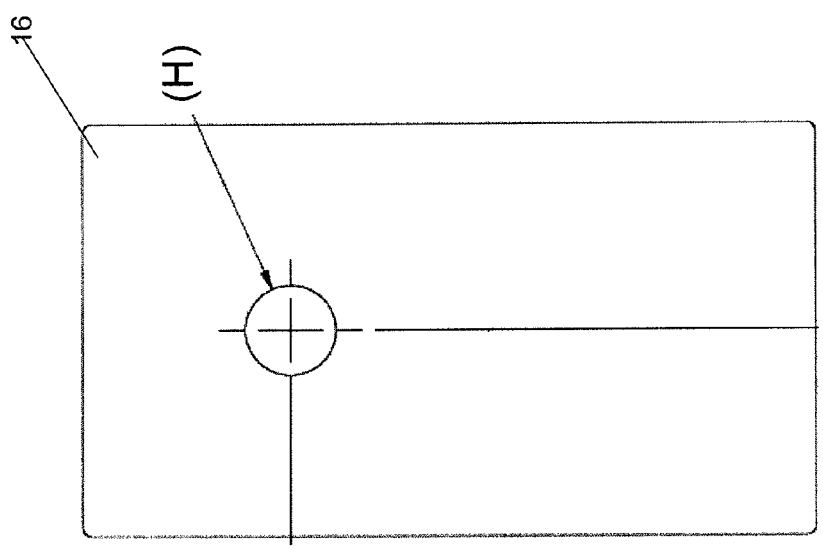
Figure 8:
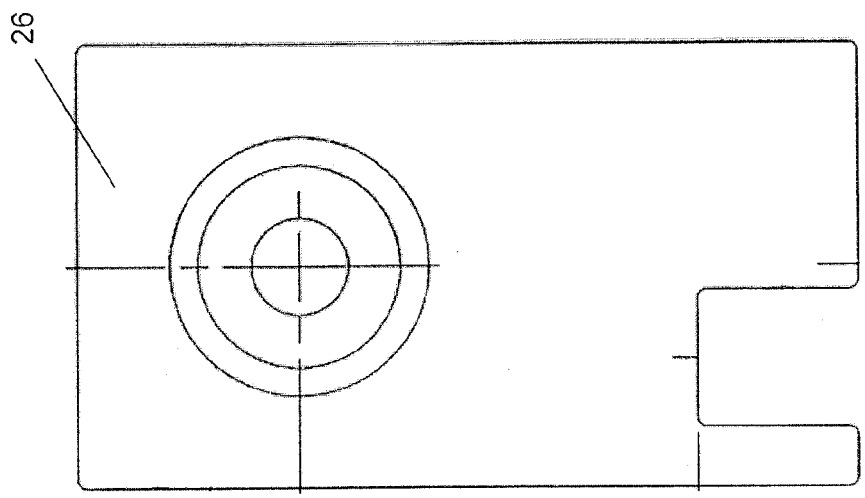
Figure 7:
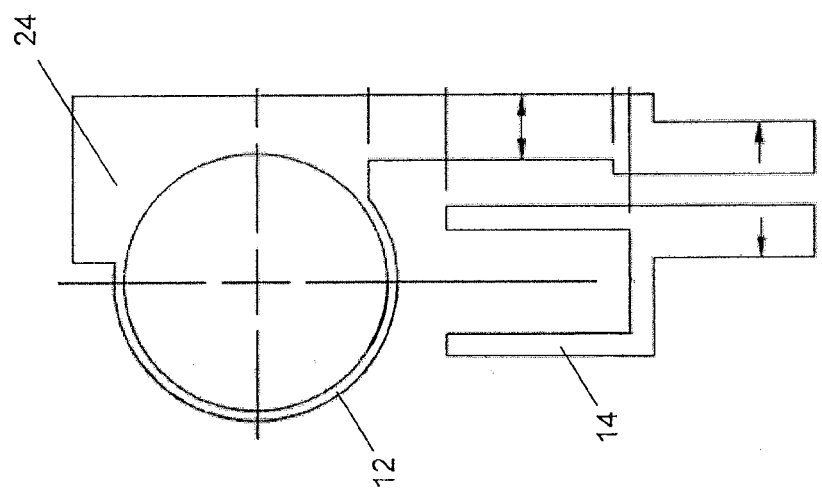
Figure 6:
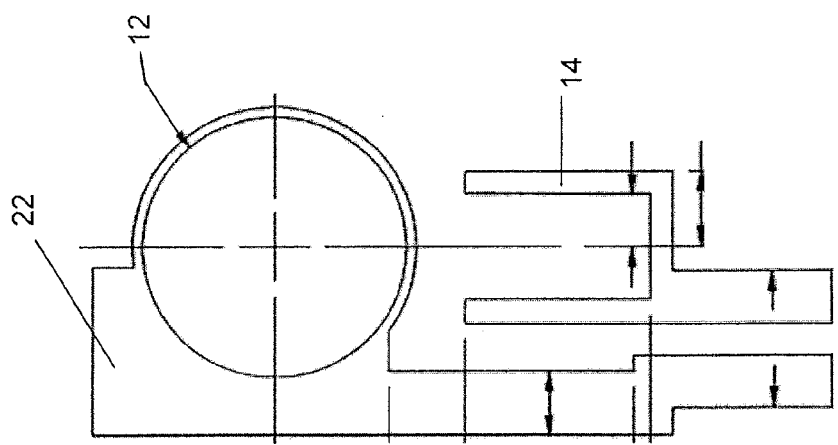

FIGS. 3-11 illustrate an exemplary embodiment for each of the layers that form the EAP cartridge 10. As illustrated in FIG. 3, the dielectric layer is substantially rectangular and may include a center through hole (H) or void (V) that may be formed during or after assembly of the EAP cartridge 10. FIGS. 4 and 5 illustrate carbon ink electrode layers 18, 20. FIGS. 6 and 7 illustrate trace layers 22, 24. The trace layers 22, 24 are configured to define conductive layers using silver to define a portion of the active region 12 and the reference region 14. FIGS. 8 and 9 illustrate the frame layers 26, 28, respectively. FIGS. 10 and 11 provide exemplary top (FIG. 10) and bottom (FIG. 11) illustrations of the EAP cartridge 10 when each of the layers 16, 18, 20, 22, 24, 26, and 28 are combined.

In one or more embodiments, it may be desirable to include one or more ventilation openings 19 in one or more of the frame layers 26, 28. The size, shape and distribution of the ventilation openings 19 may vary based on a variety of factors including, for example, application, environment in which the sensor is to be used. The ventilation openings 19 are configured to reduce temperature variation between the reference region 14 and the active region 12. Due to the low thermal conductance properties of the base material (e.g., PCB Epoxy Glass Laminate base material), the reference region 14 is inherently insulated from the other areas of the sensor assembly. The ventilation openings 19 allow temperature equilibrium between the active region 12 and the reference region 14, which ultimately improves sensor reading accuracy. The ventilation openings 19 may be as simple as a thru hole (or multiples) in either the PCB top and/or bottom layer, for example.

Figure 12:
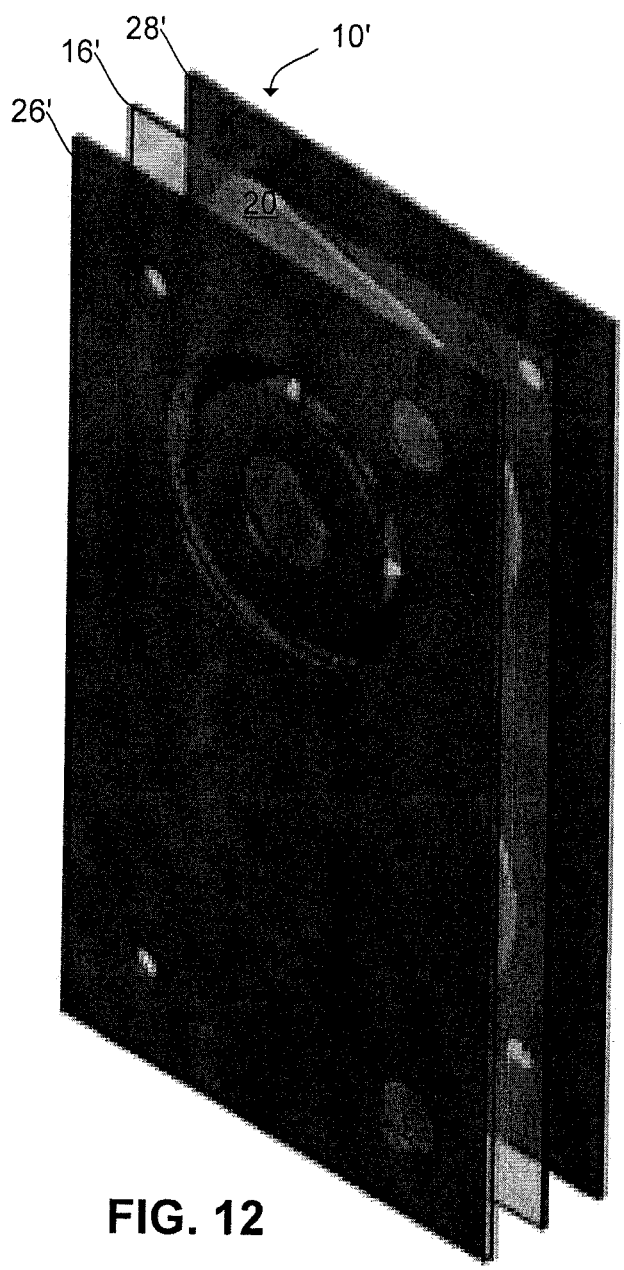

Referring to FIG. 12, another exemplary EAP cartridge 10' formed from a plurality of material layers is illustrated. It should be noted that structures having the same or similar functions described earlier are indicated with a prime (') designation. Such structures have the same function as the as the structure having the un-primed reference numerals. As described in detail below, the EAP cartridge 10' includes a plurality of layers to form an active (sensing) region 12 and a reference region 14. The active region 12 is configured to sense deflection, force, and/or pressure applied to the region 12. The size and shape of the EAP cartridge 10' may vary depending on design considerations, applications and environments in which the cartridge may be used, etc. Any size and shape of the EAP cartridge 10' shall be deemed to fall within the scope of the present invention. Likewise, the size and shape of the active region 12 and reference region 14 may be any desirable size and shape. Preferably, deflection, force and/or pressure applied to the active region 12 do not impart movement and/or a force to the reference region 14.

Figure 13:
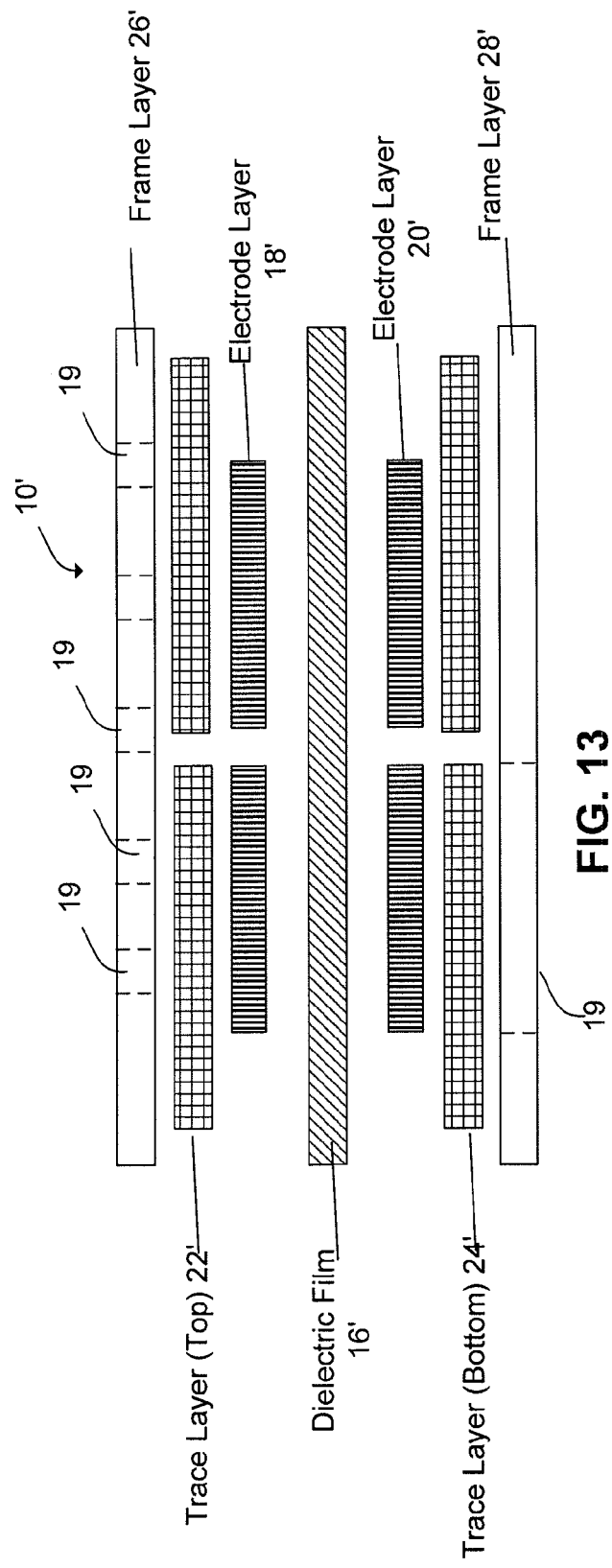

Referring to FIG. 13, a cross-section of the exemplary EAP cartridge 10' in accordance with aspects of the present invention is illustrated. The EAP cartridge 10' includes a dielectric layer 16' that separates a first electrode layer 18' and a second electrode layer 20', also referred to herein as a pair of electrodes. The first electrode layer 18' and the second electrode layer 20' are substantially the same as first electrode layer 18 and second electrode layer 20 described above. When a voltage is applied to the electrode layers 18', 20', the dielectric layer 16' and the electrodes layers 18', 20' form a capacitor that varies in capacitance based on stress (e.g., stretching of the EAP material) applied to the dielectric layer 16', as described above with respect to EAP cartridge 10.

The EAP cartridge 10' may further include trace layers 22', 24'. The trace layers 22', 24' may be applied to each side of the cartridge 10, as illustrated in FIG. 13. Unlike the trace layers 22, 24, the trace layers 22', 24' may or may not be continuous over the surface of the EAP cartridge 10'. As illustrated in FIGS. 15-18, the trace layers 22', 24' may be have a portion that is ring-shaped to facilitate outputting signals generated by the EAP cartridge 10'. Like trace layers 22, 24 above, the trace layers 22', 24' may be made from silver to form a silver buss. Other conductive materials may also be suitable. The trace layers 22', 24' provide for capacitive charge distribution as well as reducing series resistance, which improves response time and increases accuracy.

Figure 20:
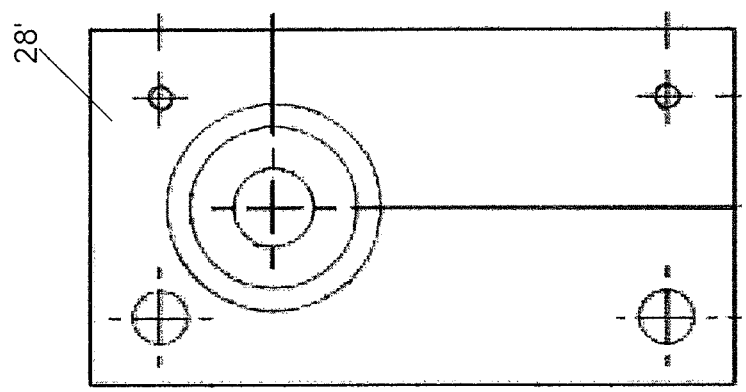
Figure 19:
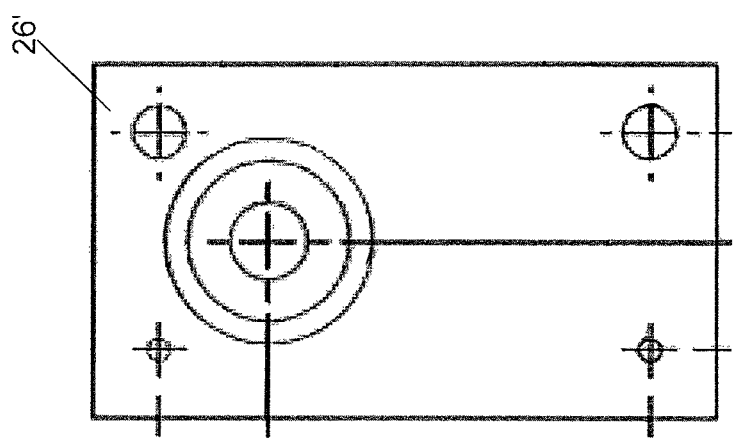
Figure 22:
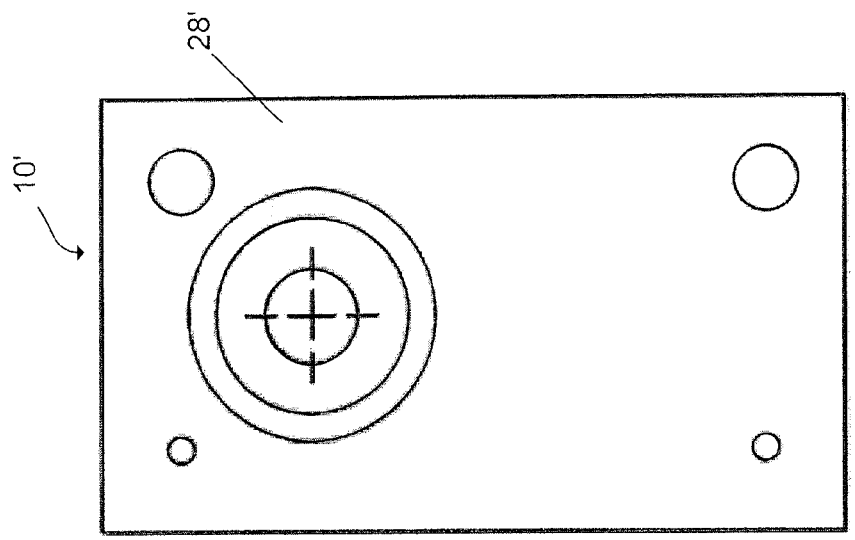
Figure 21:
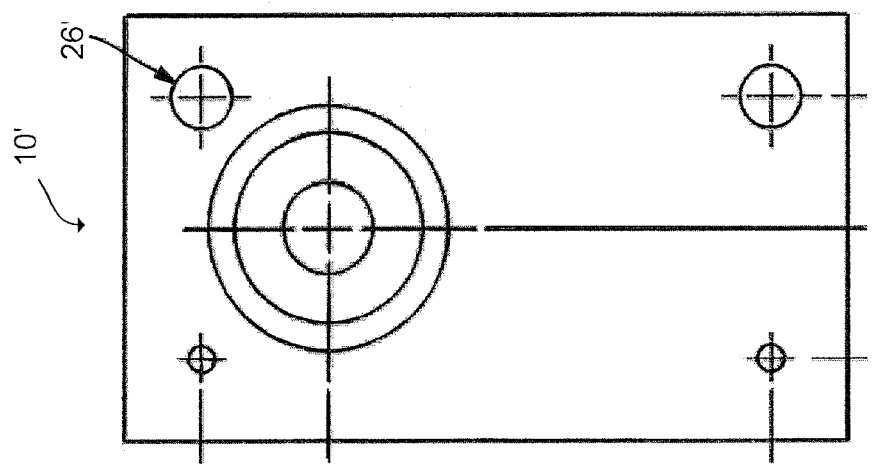

The EAP cartridge 10' may further include framer layers 26', 28'. The frame layers 26', 28' are identical to frame layers 26, 28 discussed above. FIGS. 12-20 illustrate another exemplary embodiment for each of the layers that form the EAP cartridge 10'. As illustrated in FIG. 14, the dielectric layer is substantially rectangular and may include a center through hole (H) or void (V) that may be formed during or after assembly of the EAP cartridge 10'. The EAP cartridge 10' may optionally include ventilation openings 19, as described above. FIGS. 15 and 16 illustrate carbon ink electrode layers 18', 20'. FIGS. 17 and 18 illustrate trace layers 22, 24. The trace layers 22, 24 are configured to define conductive layers using silver to define a portion of the active region 12 and the reference region 14. FIGS. 19 and 20 illustrate the frame layers 26', 28', respectively. FIGS. 21 and 22 provide exemplary top (FIG. 21) and bottom (FIG. 22) illustrations of the EAP cartridge 10' when each of the layers 16', 18', 20', 22', 24', 26', and 28' are combined.

Referring to FIG. 23, the EAP cartridge 10 is illustrated in operative contact with a buffer material layer 30. The buffer material layer 30 is configured to at least partially deflect when a force (F) is imparted on the buffer material layer 30. In response, active region 12 of the EAP cartridge 10 generates an output signal that corresponds to an amount of strain imparted on the EAP cartridge 10. Preferably, in the assembled applications, the EAP cartridge 10 is pre-stretched over the material layer 30 in order to remove slack in the cartridge in order to allow immediate response to pressure and/or force variations. In another embodiment, the EAP cartridge 10 may be configured to be placed in direct contact with the fluid being sensed (e.g., in fluidic contact).

The buffer material layer 30 may be secured to a surface of the EAP cartridge 10 and/or placed in contact with a surface of the EAP cartridge 10. Alternatively, one or more material layers may be positioned between the buffer material layer 30 and a surface of the EAP cartridge 10.

The buffer material layer 30 may perform a variety of functions depending on the application. The buffer material layer 30 may be a non-conductive elastomeric, conductive elastomeric or a metal buffer layer, which isolates the EAP cartridge 10 from a fluidic or pneumatic system media, for example. Thus, the buffer material layer 30 may be selected to provide media compatibility. The buffer material layer 30 can be in the form of a non-conductive elastomeric buffer, which additionally allows for electrical isolation of the EAP cartridge 10 from the fluidic or pneumatic system media. The buffer material layer 30 generally allows the EAP cartridge 10 to be used in a much wider range of applications, due to improved chemical compatibility. The use of buffer material layers with varying thickness and/or selected material may also allow the same EAP cartridge 10 to expand the use of an EAP cartridge 10 to a variety of pressure ranges. In addition, the buffer material layer 30 also reduces hysteresis that is inherent within the EAP cartridge 10 and improves linearity of the EAP cartridge output signal.

In one embodiment, the buffer material layer 30 may also provide a pressure seal, which allows the EAP cartridge to be used in a fluidic application, as explained below. The buffer material layer 30 may also incorporate an edge cup (or other mechanism), which maintains alignment of the buffer material layer 30 within an assembly in which it may be placed. Additionally, the buffer material layer 30 may have limited contact design with the EAP cartridge 10, as discussed below. In addition, the use of the buffer material layer 30 layer also has been found to reduce hysteresis effects inherent within the EAP cartridge 10, ultimately improving accuracy and linearity.

Due to the contact between the EAP cartridge 10 and the buffer material layer 30 and because force is directed to the EAP cartridge 10 through the buffer material layer 30, the output of EAP cartridge 10 is dependent on the buffer material layer. Thus, an EAP sensing element 10 may be easily customized for a wide range of applications simply changing the material that forms the buffer material layer 30 and/or changing the thickness or other dimensions (length, width or shape) of buffer material layer 30.

Referring to FIG. 24, a second buffer material layer 32 may also be coupled to an opposing surface of the EAP cartridge 10. Such a configuration is suitable to allow differential measurements to be made with the sensor. For example, force (F1) directed against buffer material layer 18 may be measured, as well as, force (F2) directed along an opposite axis from F1 against buffer material layer 32. The EAP cartridge 10 may include a center thru hole for use in differential pressure and/or force applications. The center thru hole eliminates excess force to both sides of the EAP cartridge 10.

As illustrated in FIG. 25, the active region 12 formed by the electrode layers 18, 20 are coupled to a power supply 34. The power supply 34 may be a stand-alone battery and/or an external power source (e.g., from a computer through a USB port or other port). Referring to FIG. 26, the power supply 34 may be formed within the EAP cartridge 10 or coupled to a flex circuit, which is coupled to the electrode layers 18, 20 (e.g., through trace layers 22, 24). Such an embodiment enables the pressure sensor 10 to have a wide variety of applications. Such applications include fluidic applications as well as mechanical (e.g., sensing a force applied to the buffer layer, use of the EAP cartridge as a load cell, strain gage, linear displacement, etc.). In one embodiment, discussed in more detail below, the buffer material layer may be configured to seal a portion of a fluid connector to protect the EAP cartridge 10 from the environment in which it is used.

Figure 27:
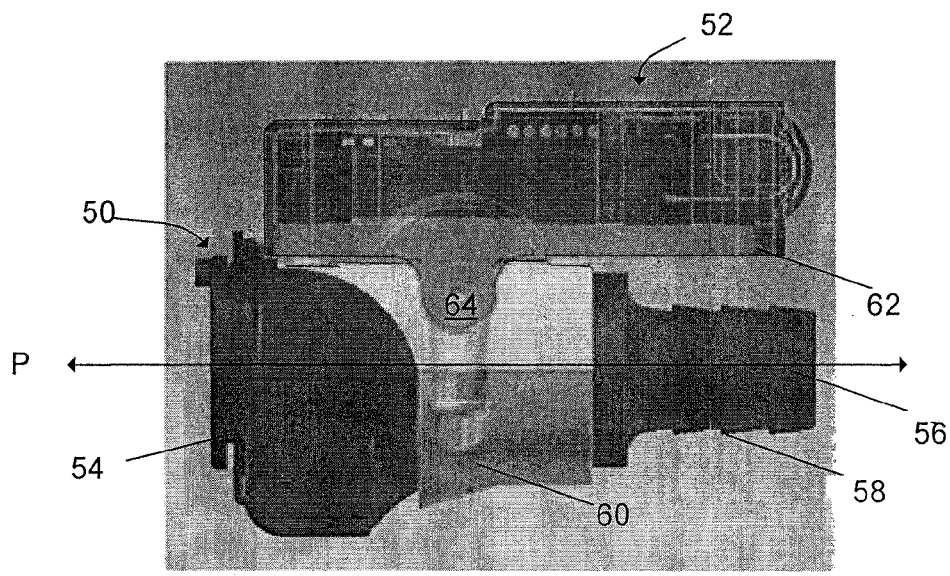

Referring to FIGS. 27-33, an exemplary fluid connector 50 having an integrated pressure sensor 52 is illustrated. Referring to FIG. 27, the fluid connector 50 has a fluid passageway (P) between an inlet port 54 and an outlet port 56. The fluid passageway (P) may be any desirable size and shape. The fluid passageway (P) is generally the primary passageway for the fluid to pass through the connector. In one embodiment, the buffer material layer is in contact with fluid passing through the fluid passageway (P). In general, fluidic contact is made on a surface of the buffer material layer that opposes the EAP cartridge 10. The fluid passing through the passageway (P) exerts a force against the buffer material layer proportionate to an amount of pressure or flow of the fluid through the connector 50.

The inlet port 54 is operative to engage with a male and/or female connector. As shown in the figures, the inlet port 54 is a quick-connect (also referred to herein as a quick disconnect connector) that is configured to receive a male and/or female coupler.

The outlet port 56 may also be configured to receiver any type of connector and/or component. For example, the outlet port 56 is configured to frictionally mate with a fluid transfer member (e.g., a hose) through ridges 58 positioned on the outer perimeter of the outlet port 56. A person of ordinary skill in the art will readily appreciate that the above examples are exemplary in nature and not intended to limit the scope to the present invention. Furthermore, an aspect of the present invention relates to integration of a pressure sensor into a quick disconnect coupler, regardless of how the pressure is sensed.

In another embodiment, the fluid connector 50 may further include a secondary passageway (P2) (illustrated in FIGS. 33B and 33C) to facilitate fluid communication between the passageway (P) and the pressure sensor 52. The secondary passageway (P2) enables the fluid to make contact with the buffer material layer (e.g., buffer material layer 30). Fluidic contact is made on a surface of the buffer material that opposes the EAP cartridge 10, for example. Generally, the secondary passageway (P2) is substantially smaller than the primary passageway (P). Fluid flowing through the secondary passageway (P2) originates from the primary passageway (P) and exerts a force against the buffer material layer. The force exerted on buffer material layer causes the buffer material layer 30 to deflect. The amount of deflection is proportionate to pressure of the fluid flowing through the passageway (P) of the fluid connector 50.

In one embodiment, the buffer material layer 30 is operative to seal the passageway (P) or the secondary passageway (P2), whichever passageway is in contact with the buffer material layer, such that fluid that enters the fluid connector 50 is prevented from reaching the EAP cartridge 10 as well as any of the electrical components that are used to process and/or communicate readings of the EAP cartridge 10, for example.

Figure 28:
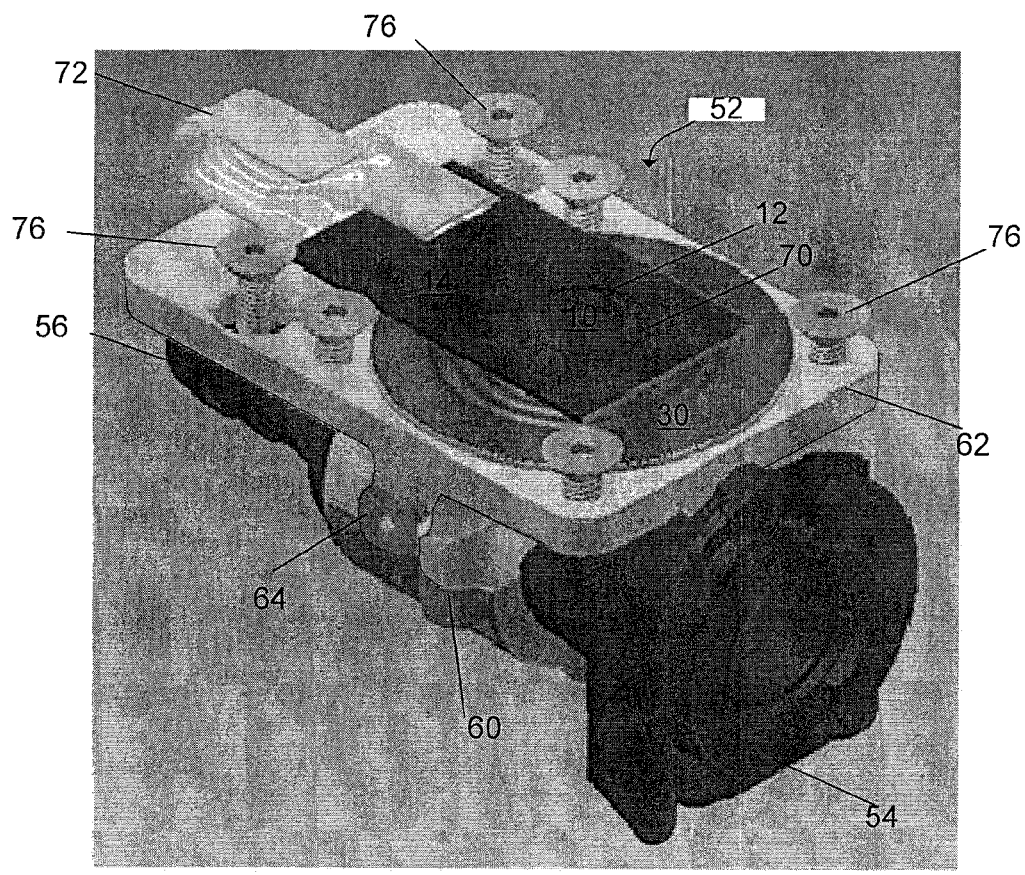

FIG. 28 is a perspective view of fluid connector 50 and pressure sensor 52, with other portions illustrated in FIG. 27 removed for illustrative purposes. As shown in FIG. 28, a base portion 64 is configured for securing the housing of the pressure sensor 52 to the fluid connector 50. The base portion 64 may be formed integrally with the fluid connector 50 and/or may be removably attached. A support member 62 is illustrated, which is configured to be secured to the base portion 60 or formed in the base portion 60. As illustrated in FIG. 28, a screw or other fastening mechanism 64 may be used to secure the support member 62 to the base portion 60. Generally, the support member 62 will have a through hole, which forms at least a portion of the secondary passageway (P2). As set forth above, the secondary passageway enables fluid to deflect the buffer material layer 30 into the EAP cartridge 10. The buffer material layer 66 may be configured to rest and/or securely attach to the support member 62.

In one embodiment, the EAP cartridge 10 is a composite pressure sensing element 68 in the form of a film. The EAP cartridge 10 is configured to be in contact with the buffer material layer 66, at least in the active region 12 of the EAP cartridge 10. As illustrated in FIG. 28, the active region 12 may be in the form of a ring 70 or other shape to reference an active region area of the EAP cartridge 10, for example. In general, the ring 70 may be positioned along a parallel axis with the secondary passageway (P2). In another embodiment, it may be desirable to offset the active region 12 of the EAP cartridge 10 from the secondary passageway (P2).

As illustrated in FIG. 28, a flex circuit 72 may operably couple the EAP cartridge 10 to the power source 34. The flex circuit 72 may also be configured to output one or more of the signals from the EAP cartridge 10. In an alternate embodiment, the EAP cartridge 10 may be pinned or otherwise secured to a printed circuit board 80. In such an embodiment, there may not be a need for the flex circuit 72.

Figure 29:
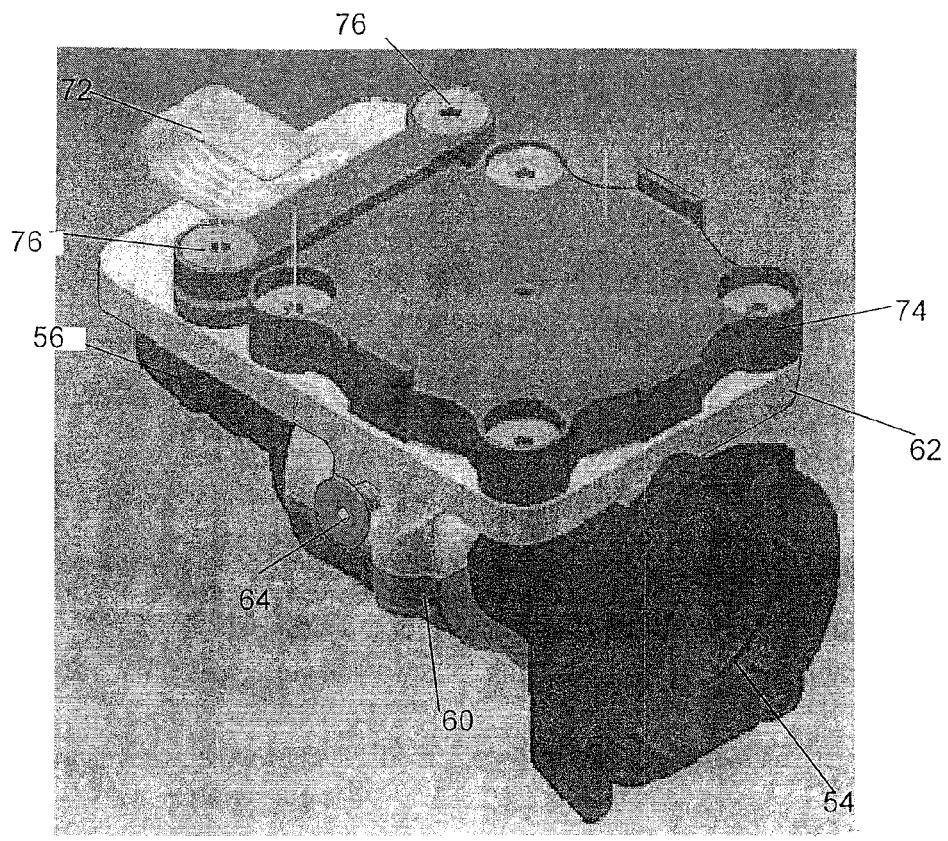
Figure 30:
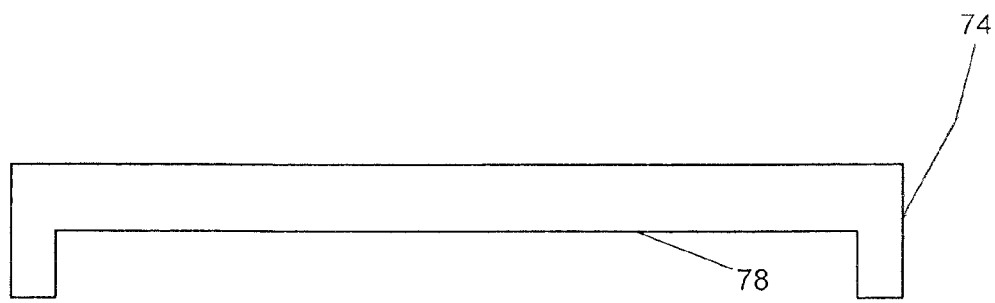

FIG. 29 illustrates an exemplary cap member 74 that is configured to be secured over the support member 62. The cap member 74 and may be fastened and/or secured to the support member 62 by one or more screws 76 or other fastening member types. The cap member 62 may be configured to limit the maximum deflection of the active region 12 of the EAP cartridge, which prevents the active region 12 of the EAP cartridge 10 from deflecting to a point of rupture in the event of over-pressurization. As illustrated in FIG. 30, the cap member 74 may be flat across along the underside 78 of the cap member that covers the EAP cartridge 10. In another embodiment, the cap member 62 may include a protrusion or other structure over the active region 12 of the EAP cartridge 10. In still another embodiment, the cap member 74 may have a recess formed therein to allow increased deflection over the active region 12.

A person of ordinary skill in the art will readily appreciate that the size and shape of the cap member 74 may vary based on the amount of designed deflection and/or the application in which the EAP cartridge 10 is to be used.

Figure 31:
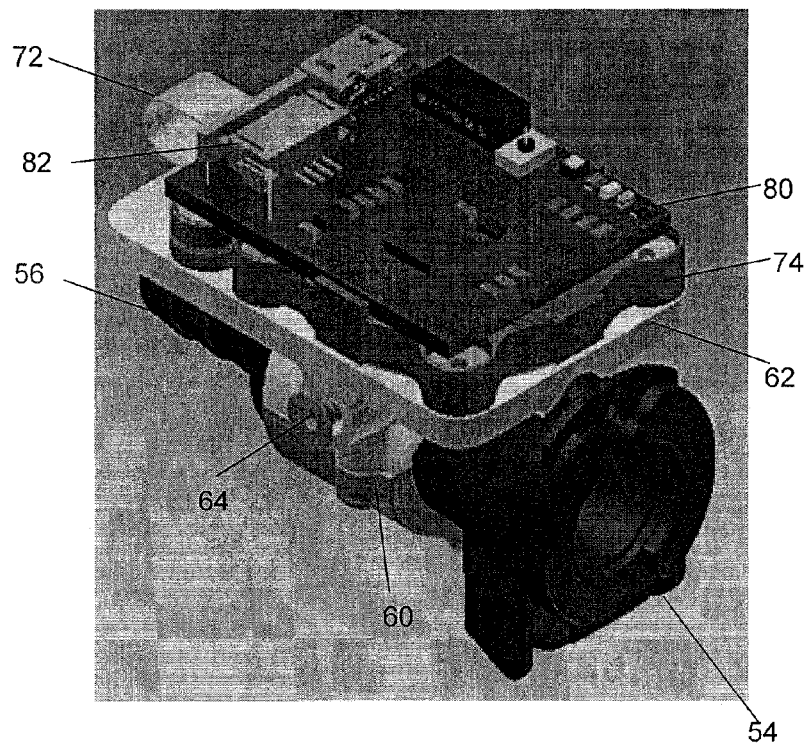

Referring to FIG. 31, a printed circuit board 80 is illustrated coupled to the cap member 74. For purposes of this disclosure, the printed circuit board 80 is illustrated separate from the flex circuit 72. However, the printed circuit board 80 and the components secured to the printed circuit board 80 may be integrated into the flex circuit 72. In another embodiment, the EAP cartridge 10 may be direct mounted to the printed circuit without using the flex circuit 72, for example by pinning and/or otherwise securing the EAP cartridge 10 to the printed circuit board 10, without need of the flex circuit 72, for example. The printed circuit board 80 may include any electrical components operative to provide the functionality desired by the designer. For example, the printed circuit board 80 may include the power source 34 that is directly coupled to the printed circuit board 80. In addition and/or alternatively, the printed circuit board 80 may include a receptacle 82 that is configured to receive power signals for use by the EAP cartridge 10 from an external source. For example, the receptacle 82 may be a universal serial bus (USB), which has a defined set of input and output signals. The receptacle 82 may be operative to couple the printed circuit board 80 directly to a power source, which may be a computer and/or any other source of power suitable for connecting with a USB connector.

In one embodiment, data output from the EAP sensing element 10 may be received through the receptacle 82 and output to a remote storage source, which may be for example a computer, a dedicated hard disk drive, and/or a memory (e.g., a flash memory, or other memory type). In another embodiment, data may be output from the EAP cartridge 10 wirelessly through a wireless adapter coupled to the printed circuit board 80.

Figure 32:
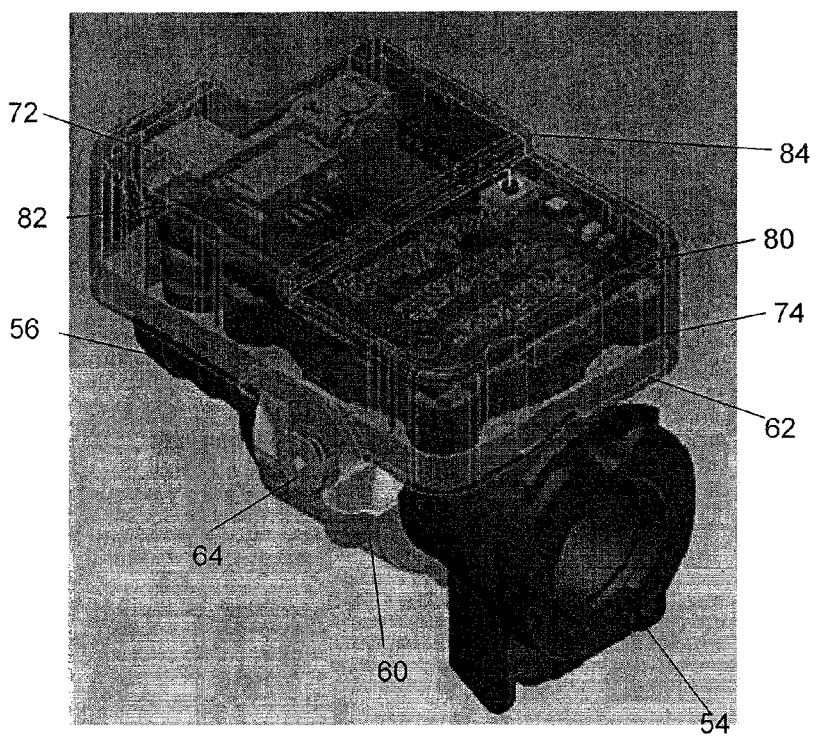

FIG. 32 illustrates a cover 84 that covers components of the pressure sensor supported by the support member 62. The cover 84 may be a snap-on cover and/or a cover that requires one or more fastening elements to secure the cover to the support member 62. An exemplary fastening element may include one or more screws or other fastening mechanisms. The cover 84 generally prevents exposure of the electrical components contained in the pressure sensor 52 to the environment.

Figure 33C:
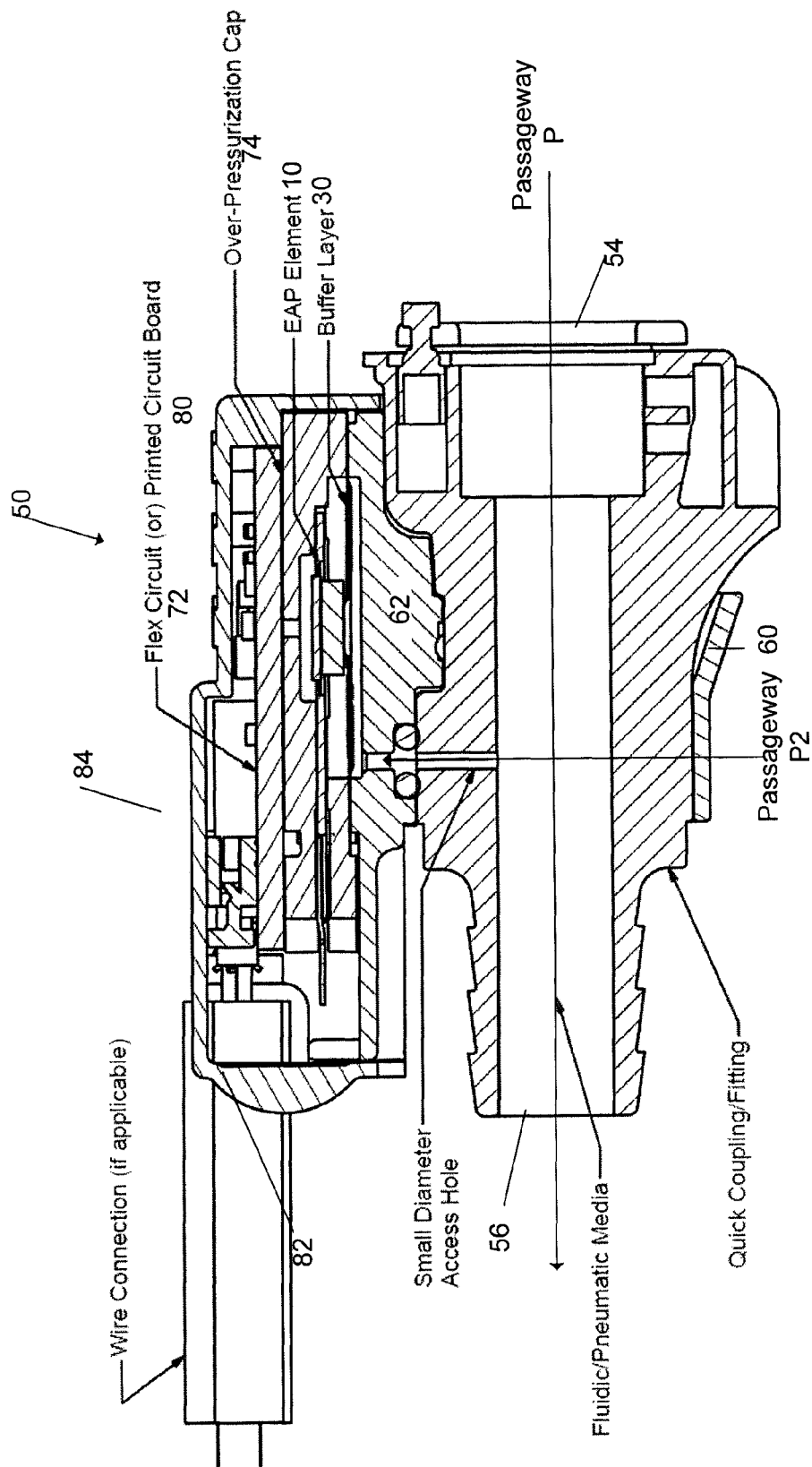

FIGS. 33A-33C illustrate exploded views and a cross-section view of an exemplary embodiment of the fluid connector 50. Referring to FIGS. 33A and 33B, the fluid connector 50 includes an inlet port 52 and an outlet port 54 that forms a passageway (P). The connector 50 also includes a pressure access hole for forming the secondary passageway (P2). The base portion 64 engages around the passageway (P) and is secured to the support member 62 through one or more fastening members. A seal 90 is provided between the support member 62 and the coupler in order to prevent fluid leakage from the access hole associated with the secondary passageway (P2), for example. The seal 90 may be any type of seal that is sufficient to prevent fluid leakage in the fluid connector 50. An exemplary seal 90 may be an o-ring type seal. The passageway (P2) extends into the support member 62. The buffer material layer 30 is in fluid communication with the secondary passageway (P2), such that the buffer material layer 30 deflects based on the amount of force exerted by the fluid entering the secondary fluid passageway (P2). In this embodiment, the secondary passageway (P2) is offset from the active region of the EAP cartridge 10. The buffer material layer 30 engagingly seals fluid from escaping the secondary passageway (P2). That is, the buffer material layer prevents fluid passing through the secondary passageway (P2) from contacting the EAP cartridge 10. It should be noted that the buffer material layer may be in direct fluid communication with the passageway (P), instead of the secondary fluid passageway. For example, fluid travelling between the inlet port and the outlet port may exert a force on the buffer material that causes a deflection of the buffer material layer.

The active region 12 of the EAP cartridge 10 is in contact with the buffer material layer 30 and is configured to sense the amount of the deflection of the buffer material layer 30. In the embodiment illustrated in FIGS. 33A-33B, a spacer 92 may be secured to the active region 12 of the EAP cartridge 10. The spacer 92 is configured to engage cap member 74 in order to prevent rupture of the active region 12 by limiting deflection of the active region 12, which may be caused by over pressurization.

The EAP cartridge 10 outputs a differential capacitive signal representative of the sensed deflection of the buffer material layer 30. As illustrated in this embodiment, a print circuit board 80 is coupled to the cap member 74. The print circuit board includes a port for receiving a USB connector cable 94. The USB cable 94 is configured to provide power to the EAP cartridge 10 and receive signals output from the EAP cartridge 10. In one, embodiment, the output signals may be representative solely of the signals output from the active region 12 of the EAP cartridge 10. In another embodiment, output signals corresponding to the active region 12 and the reference region 14 of EAP cartridge 10 may be output through the USB cable 94 or other wire transmission sources (e.g., flying leads, etc.). As explained above, in other embodiments the output signals may be wirelessly transmitted to a processing and/or storage device.

Once the data is stored in a data storage element and/or received by a processing device, the data may be processed to determine an actual pressure detected at the fluid connector 50. Generally, the calibration process involves comparing the reference region output signal with a corresponding (in time) output signal from the active region 12 and correlating a pressure value to a change in strain applied to the EAP cartridge 10. As explained, above, since the EAP cartridge 10 is generally not in direct fluid communication with the passageway, the calibration process generally should also include the buffer material layer 18 to be used. Once the calibration process is complete, the results may be stored as a function and/or in a lookup table. Data from the reference regions and active regions are compared to derive an output signal caused primarily from the deflection sensed by the active region of the EAP cartridge. In the case of the calibration results being stored as a function, the output signal is then processed according to the function to determine a corresponding pressure value. If the calibration process involved a lookup table, the output signal will be compared to the table and a corresponding pressure value associated with the output signal may be determined. A person of ordinary skill in the art will readily appreciate that there are number of ways to correlate strain detected by the EAP cartridge 10 to an associated pressure.

Another embodiment of the EAP cartridge 10 is illustrated in FIGS. 34, 35 and 36A-36C and will be referred to as sensor 100. The sensor 100 includes a dielectric layer 102 coupled between planar members 104, 106. The dielectric layer 102 may be identical to the dielectric layer 16 discussed above. The planar members may be made of any desirable material. Preferably the planar members are formed from a printed circuit board (PCB) or similar type of material.

Figure 34:
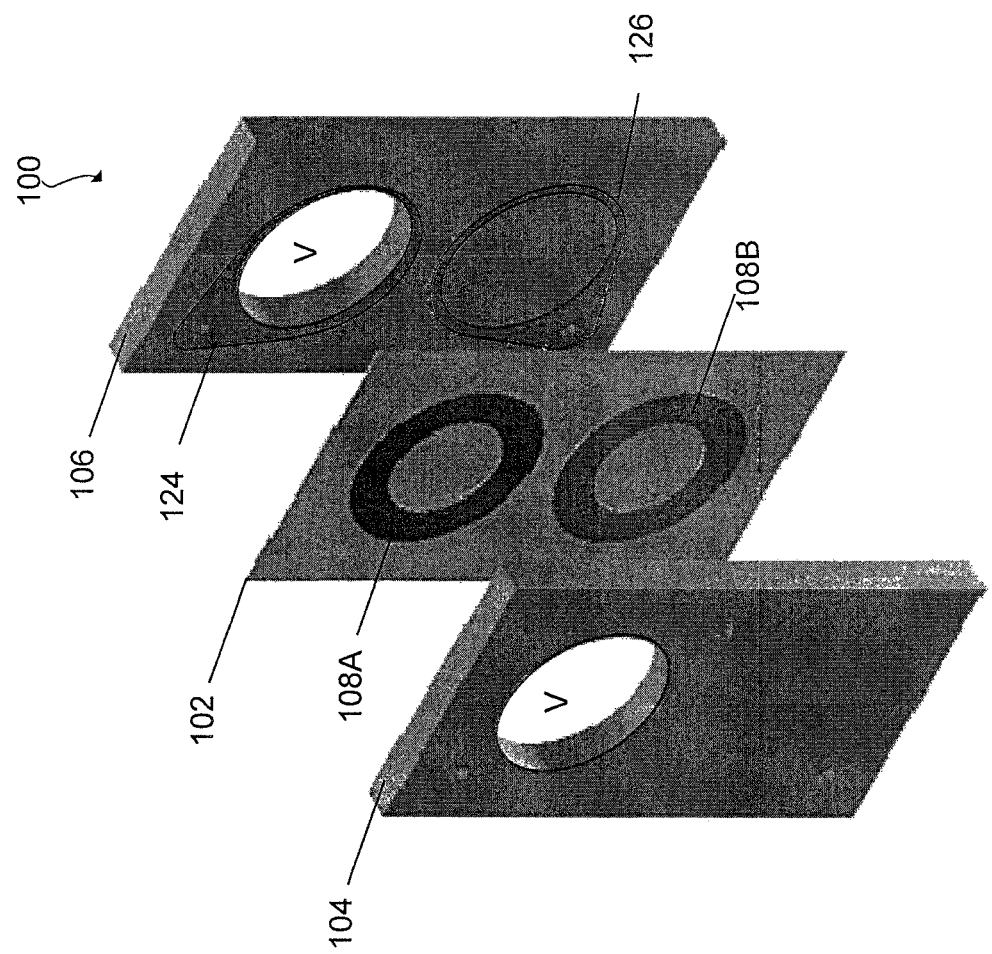
FIGS. 34, 35 and 36A-36C are exemplary sensor layers in accordance with aspects of the present invention.
Figure 35:
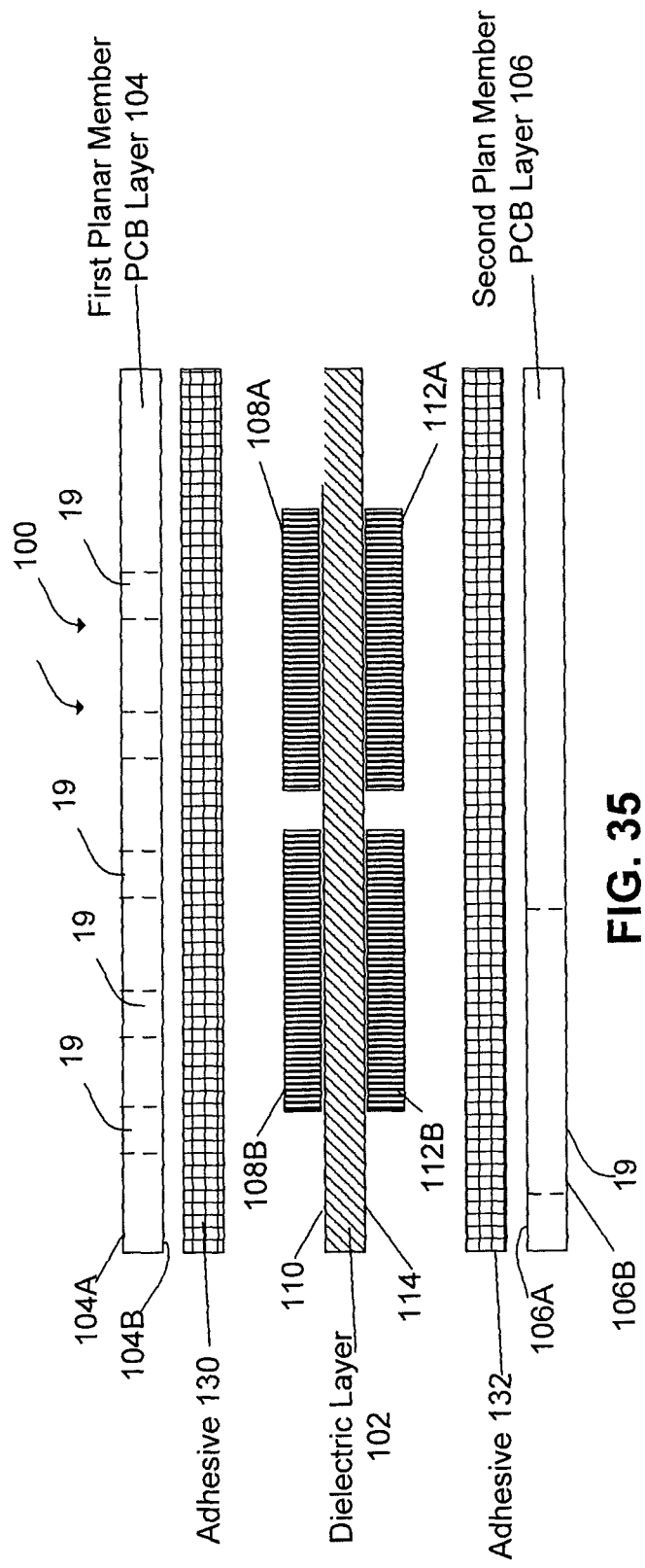

As illustrated in FIGS. 34 and 35, the dielectric layer 102 includes a first pair of electrodes 108A, 108B on a first surface 110 of the dielectric layer 102 and a second pair of electrodes 112A, 112B on a second surface 114 of the dielectric layer 102. As illustrated in FIG. 35, the first surface 110 and the second surface are on opposing sides of the dielectric layer 102. The electrode pairs 108, 112 may be applied to the dielectric layer 102 in any desired manner. For example, electrodes 108, 112 may be printed, etched or otherwise secured to the dielectric layer 102.

As discussed above, one of the electrode pairs (e.g., 108A and 112A or 108 B and 112B) are used to form an active region (e.g., 108A and 112A) and a reference region 108B and 112B), which function identically to the description set forth above with respect to active region 12 and reference region 14. The electrode pairs 108 and 112 are generally aligned, as described above with respect to electrode layers 18 and 20.

The first planar member 104 has a first hole (H) or void (V) formed between opposing surfaces (104A and 104B), as shown in FIG. 35). The second planar member 106 includes a second hole (H) or void (V) formed between opposing surfaces (e.g., 106A and 106B) of the second planar member. The first void and the second void are configured to align with the active region of the sensor 100.

The first planar member 104 includes a first node (also referred to herein as a trace or contact) 120 and a second node 122 formed on a surface of the 104B of the planar member 104. The node 120 is configured to engage with the electrode corresponding to the active region (e.g., 108A) and the node 122 is configured to engage with the electrode corresponding to the reference region (e.g., 108B). In a similar manner, the second planar member 106 includes a first node 124 and the second node 126 formed on a surface 106A of the second planar member 106. The node 124 is configured to engage with the electrode corresponding to the active region (e.g., 112A) and the node 122 is configured to engage with the electrode corresponding to the reference region (e.g., 112B).

When used within a fluid pressure sensor, the active region of the sensor 100 (e.g., a portion of the dielectric layer 102 encompassed by electrode layers 108A and 112A) will deflect, changing the capacitive output of the sensor 100. In this embodiment, sensor is formed by an EAP film (with conductive electrodes) that is physically positioned between the two (2) planar members (e.g. printed circuit board (PCB) layers), which are then mechanically joined (e.g., with adhesive). In this configuration, the EAP element outputs signal is directly in contact with receiving nodes on the PCB layers.

As discussed above, when a voltage is applied to the electrode pairs 108, 112, the dielectric layer 102 and the electrodes pairs 108, 112 form a capacitor that varies in capacitance based on stress (e.g., stretching of the dielectric layer) applied to the dielectric layer 102. The output capacitance and/or resistance may be correlated to strain applied to the material. For example, the dielectric layer 102 is configured to change thickness and surface area based on an amount of force and/or pressure applied to the dielectric layer 102, which changes the output capacitance of the capacitor formed by the dielectric layer 102 and the electrode layers 108, 112.

As illustrated in FIG. 35 a layer of adhesive 130 may be used to secure the first planar member 104 to the dielectric layer 102. A second layer of adhesive 132 may be used to secure the second planar member 106 to the dielectric layer 102. A person of ordinary skill in the art readily appreciate that the adhesive layer 130, 132 may be first applied to the planar member and then secured to the dielectric layer 102 or adhesive may be applied to the opposing surfaces of the dielectric layer 102 and the planar members may then secured to the dielectric layer 102. Furthermore, the adhesive is described herein as being applied in a layer-wise manner. As used herein, layer-wise should be interpreted broadly and includes any adhesive applied between two structures, whether or not the adhesive is continuous or discontinuous.

The adhesive layers 130, 132 may be any type of adhesive and may be continuous or discontinuous. Suitable adhesive material include, for example, pressure sensitive adhesive, curable pressure sensitive adhesive, UV curable pressure sensitive adhesives, epoxies, cyanoacrylates, urethanes, acrylics, thermosetting adhesives, etc.

The EAP sensor 100 may optionally include ventilation openings 19 formed in one or more layers of the sensor, as described above.

Figure 36A:
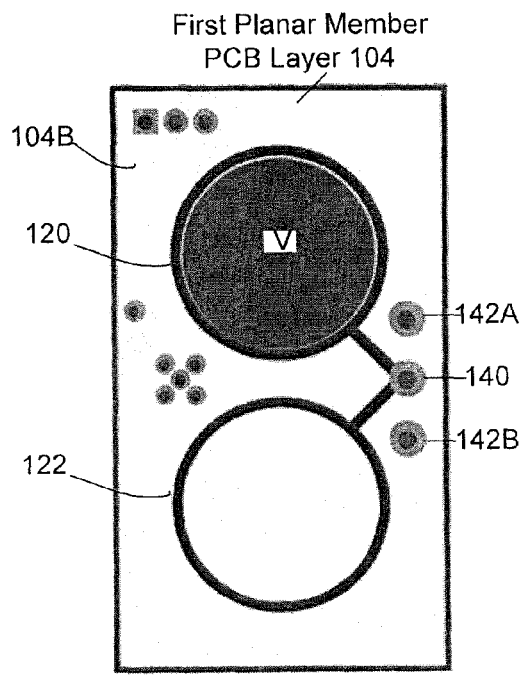

Referring to FIG. 36A, nodes (traces) 120, 122 may also be coupled to a ground reference port 140. Additional signaling ports 142A and 142B are also provided to enable common group signaling between the planar members 104, 106. Additional input output ports 144 may also be included to enable input and/or output signals to the sensor 100.

Figure 36B:
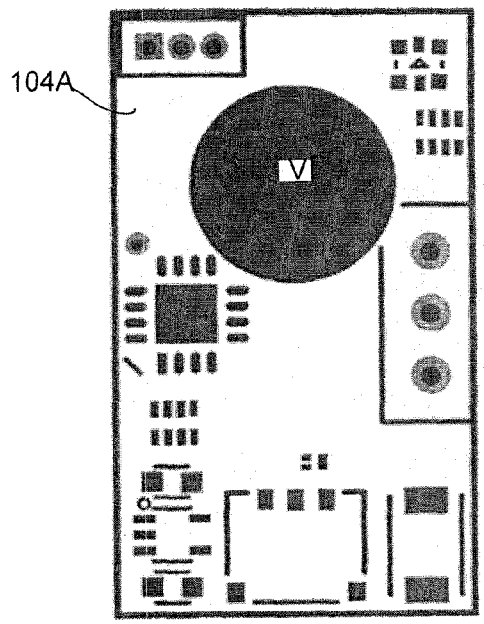
Figure 36C:
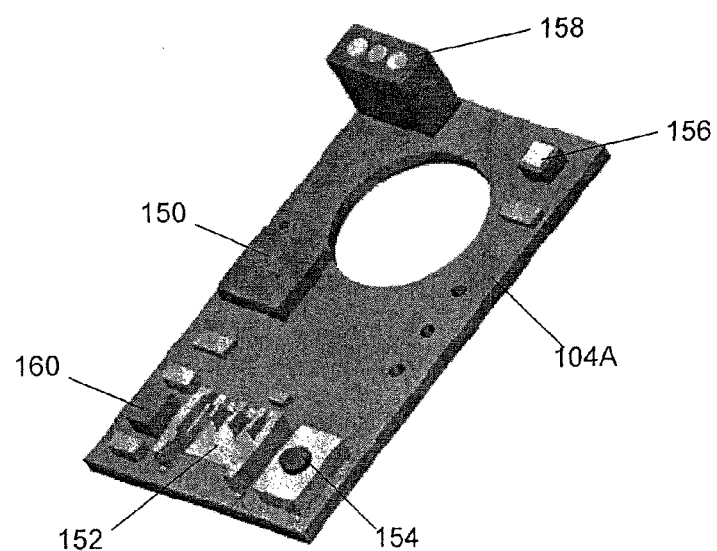

Referring to FIGS. 36B and 36C, the top surface 104A of the first planar member 104 is illustrated. In FIG. 36B, a number of signaling configurations or electrical couplings may be utilized to avoid the requirement for using a flex strip as discussed above. Exemplary electrical components suitable for mounting on the surface 104A include, for example, a processor 150, a connector 152, and on-off pushbutton switch 154, a RGB let LED light 156, a connector 158 and a power source 160, which optionally may be coupled to an external source (e.g., through a connector 152, 158). A person of ordinary skill in the art will readily appreciate that the electrical components on a sensor 100 may vary based on the application and/or the desired communication protocol to be implemented. For example, if it is desirable for the sensor 100 to output information wirelessly, a suitable adapter (a wireless adapter, a Bluetooth adapter, a Wi-Fi adapter, near field communication (NFC) or any other suitable adapter) may be mounted to the surface 104A or another surface of the sensor 100, for example.

In order to improve mechanical stability and contact with the electrode pairs 108, 112, one or more PCB pins may be secured between the first planar member 104 and the second planar member 106. A person of ordinary skill in the art will readily appreciate that a configuration of one or more PCB may be utilized to ensure that the electrode pairs 108, 112 maintain contact with the corresponding node (or trace).

Figure 37:
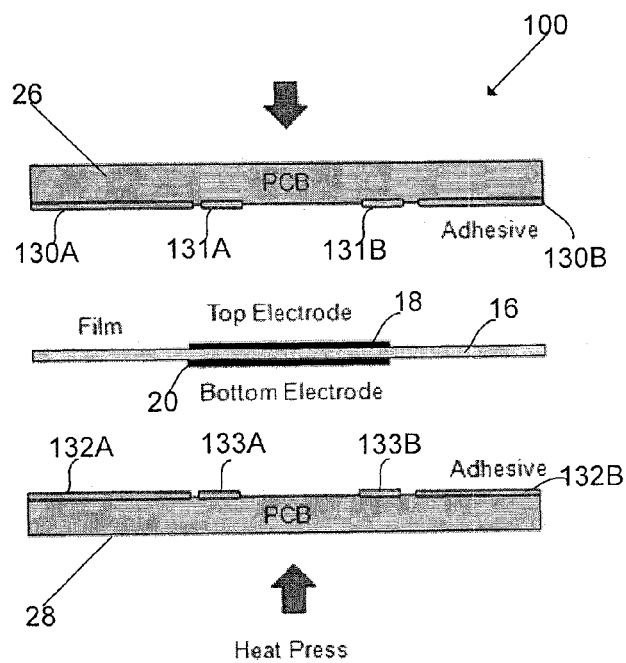
FIG. 37 is a cross-section of an exemplary sensor in accordance with aspects of the present invention.
Figure 38:
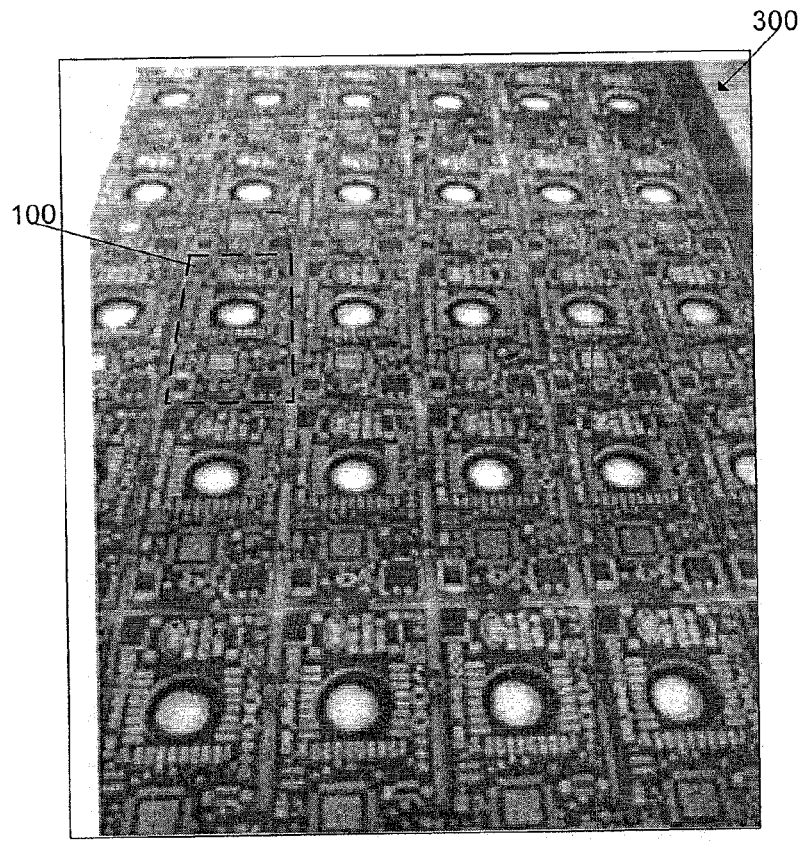
FIG. 38 is a perspective view of an exemplary web of EAP cartridges in accordance with aspects of the present invention.

Another example of sensor 100 is illustrated in FIG. 37. The sensor 100 includes electrode layers 18, 20 with a dielectric layer film 16 disposed between them, as described above The frame layer 26 may be coupled to an adhesive layer 130, which is discontinuous (e.g., portions 130A, 130B) for forming the sensor 100. Contacts 131A and 131B may be positioned between the adhesive portions 130A, 130B. The contacts 131A and 131B may also be coupled to the frame layer 26 in order to form an electric circuit between the electrode layers 18, 20 and the dielectric film layer 16 and corresponding contacts 133A, 133B on the second frame layer 106, for example. The frame layer 28 may be configured as discussed above with respect to frame layer 26. The frame layer 28 may be coupled to an adhesive layer 132, which is discontinuous (e.g., portions 132A, 132B) and contacts 133A, 133B. The frame layer 26, the electrode layers 18, 20 and dielectric film 16 may be compressed together in a heated environment to form one or more sensors 100. A web of such sensors is illustrated in FIG. 38.

Figure 39:
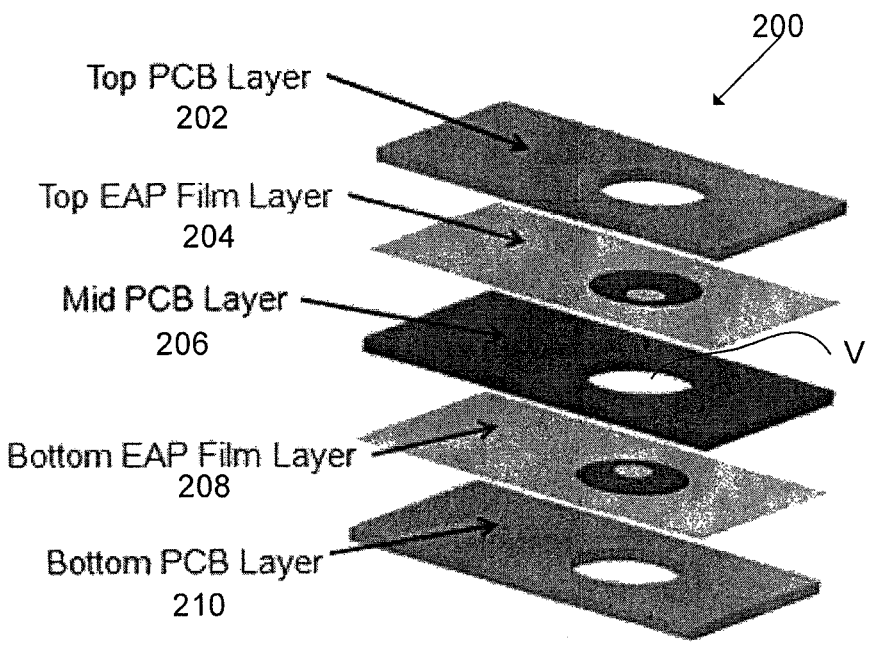
FIG. 39 is an exploded view of various layers of another exemplary sensor in accordance with aspects of the present invention.
Figure 40:
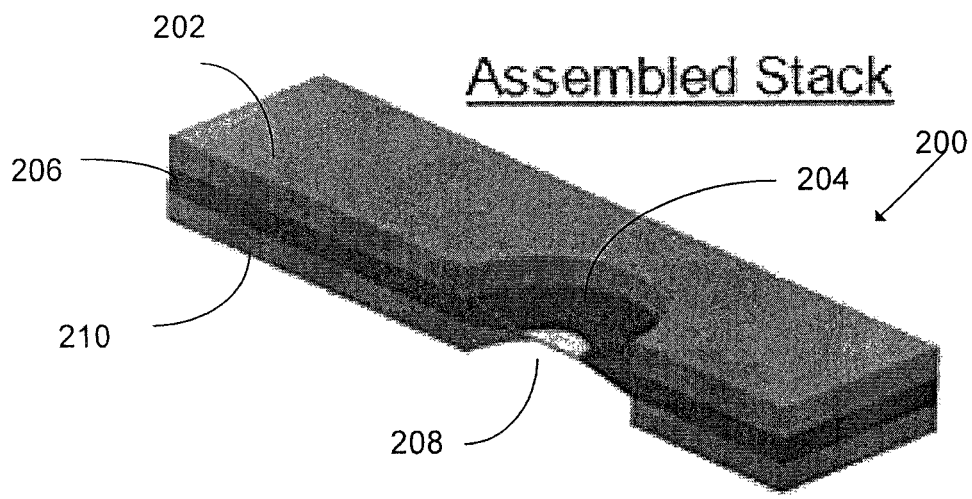
FIG. 40 is a cross-section view of the exemplary sensor illustrated in FIG. 39.

Another exemplary sensor 200 is illustrated in FIGS. 39-40. In FIGS. 39-40, multiple layers of frame layer (e.g., PCB) 202, EAP cartridge 204, frame layer (e.g., PCB) 206, EAP cartridge 208 and frame layer (e.g., PCB) 210 are combined (or sandwiched) to form a sensor 200 that is a hybrid of sensor 100. This multi-layer configuration may allow for a greater EAP element capacitive output signal (versus the PCB/EAP/PCB configuration) given the same amount of applied strain. This result is due to the increased total capacitive surface area with the additional layers. This design further also allows for positional identification of each film element. In a practical application, this would allow the film elements to differentiate between vacuum and differential pressures. Although more complex and costly, this multi-layer sandwich configuration may have benefit for future specific applications where diaphragm deflection (and also applied strain) may be limited. Although the sensor 200 is illustrated without a reference region, it may be desirable for the sensor to include an active region 12 and a reference region 14, as discussed above.

The sensor 200 includes a first EAP assembly 204 and a second EAP assembly 206. The EAP assembly 204, 206 may be in the form of EAP cartridges discussed above. The sensor 200 includes an insulative layer 206 (e.g., PCB) that is coupled between the first EAP assembly and the second EAP assembly. As illustrated, the insulative layer 206 includes one or more voids (V) to facilitate sensor functionality. The first EAP assembly 204 and the second EAP assembly 206 are each configured to generate an output signal that corresponds to an amount of strain imparted on each of the respective assemblies. Like the EAP cartridges discussed above, the first EAP assembly 204 and the second EAP assembly 206 include respective active regions, substantially aligned one over another when forming the sensor and, optionally may also include a reference region (not shown).

The sensor 200 (e.g., buffer material layer 30) operably coupled to the first EAP assembly, wherein the first buffer material layer is configured to at least partially deflect when force or pressure is imparted on the first buffer material layer. The sensor may optionally also include a second buffer material layer (e.g., buffer material 30) operably coupled to the second EAP assembly, wherein the second buffer material layer is configured to at least partially deflect when force or pressure is imparted on the second buffer material layer.

Figure 41:
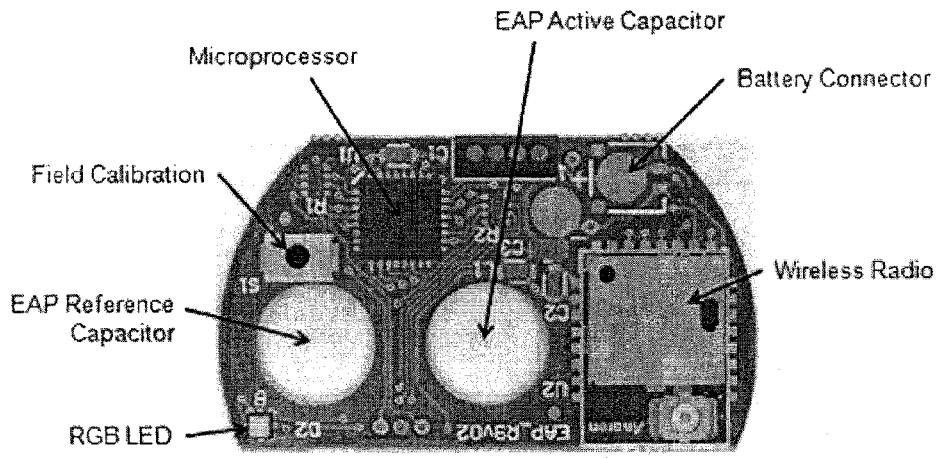
FIG. 41 is an exemplary sensor layer in accordance with aspects of the present invention.

Referring to FIG. 41, a variety of electronic components may be coupled to one of the frame layers to facilitate outputting sensor information to one or more associated devices. The electronic components may include microprocessor, calibration controls, one or more light emitting diodes, a wireless transceiver, battery connector, a connector for a wired communication, etc.

Figure 42:
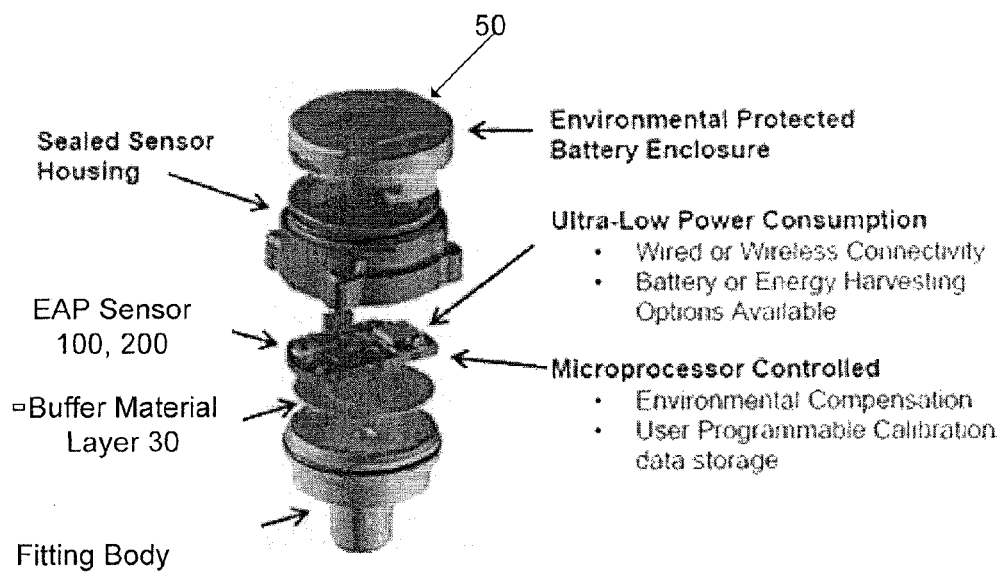
FIG. 42 is another exemplary fluid connector in accordance with aspects of the present invention.

As illustrated in FIG. 42, the components of the sensor 100, 200 may be disposed within a body 50 having a primary fluid passageway defined between an inlet port and an outlet port, wherein at least one of the first buffer material layer and the second buffer material layer are configured to at least partially deflect when force or pressure is imparted on the buffer material layer by fluid entering the primary fluid passageway.

Figure 43:
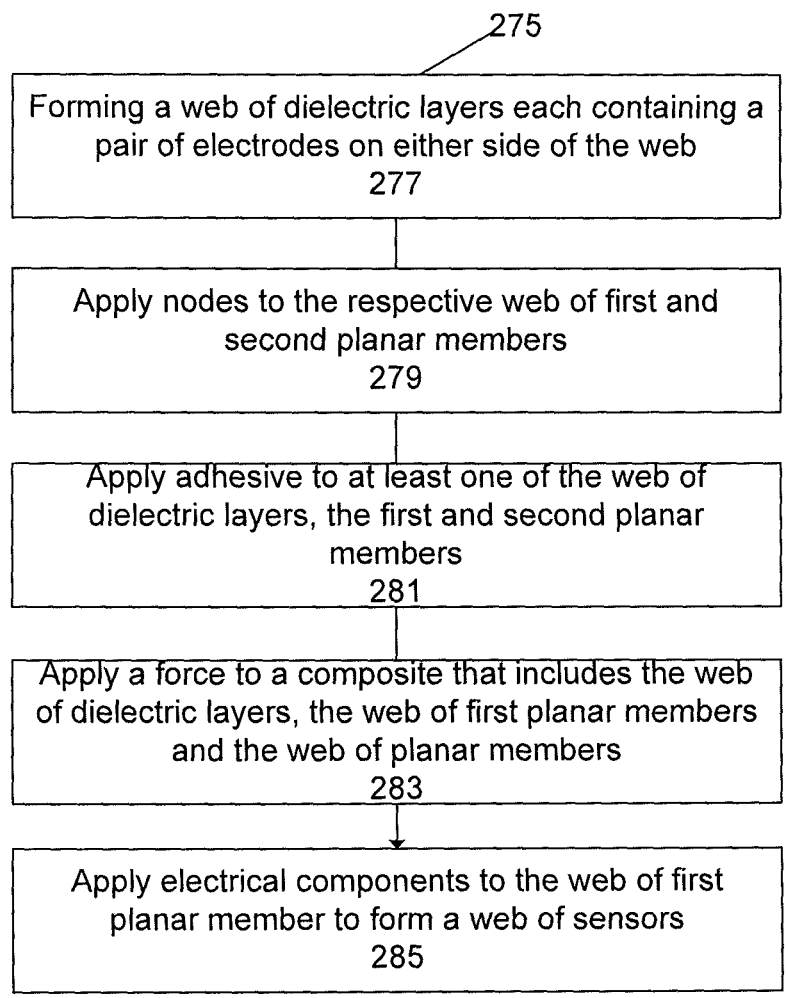
FIG. 43 is an exemplary method in accordance with aspects of the present invention.

A method 275 of assembling a web of sensors 300 will now be disclosed, as illustrated in FIG. 43. Referring to FIG. 43, the method includes combining the web of dielectric layers 302 with a web of first planar members 304 and a web of second planar members 306 by using an adhesive to secure the web of first center members 304 and the web of second planar members 306 to the web of dielectric layers 302.

Referring to FIG. 43, at block 277, a web of dielectric layers each containing a pair of electrodes 108, 112 are formed on either side of the web of dielectric layers 302. The electrode pairs may be formed simultaneously and/or separately (e.g., one side at a time). In one embodiment, the pairs of electrodes may be printed on the substrate using a conductive material, such as silver conductive ink, in a pattern defining the prescribed electrode. The ink may be printed using silk screening techniques, such as in a sheet fed or roll operation, for example.

At block 279, the nodes 120, 122, 124 and 126 are applied to the respective web of planar members 104, 106 at prescribed positions.

At block 281, adhesive is applied to at each of the web of dielectric layers 302, the first planar member 304 and the second planar member 306 at prescribed positions.

At block 283, a force is applied to a composite that includes one each of the dielectric layer 102, the first planar member 104, second planar member 106 and adhesive to secure the first planar member 104 and the second planar member 106 to the dielectric layer 102 for each individual sensor 100 in the web of sensors 300.

Figure 44:
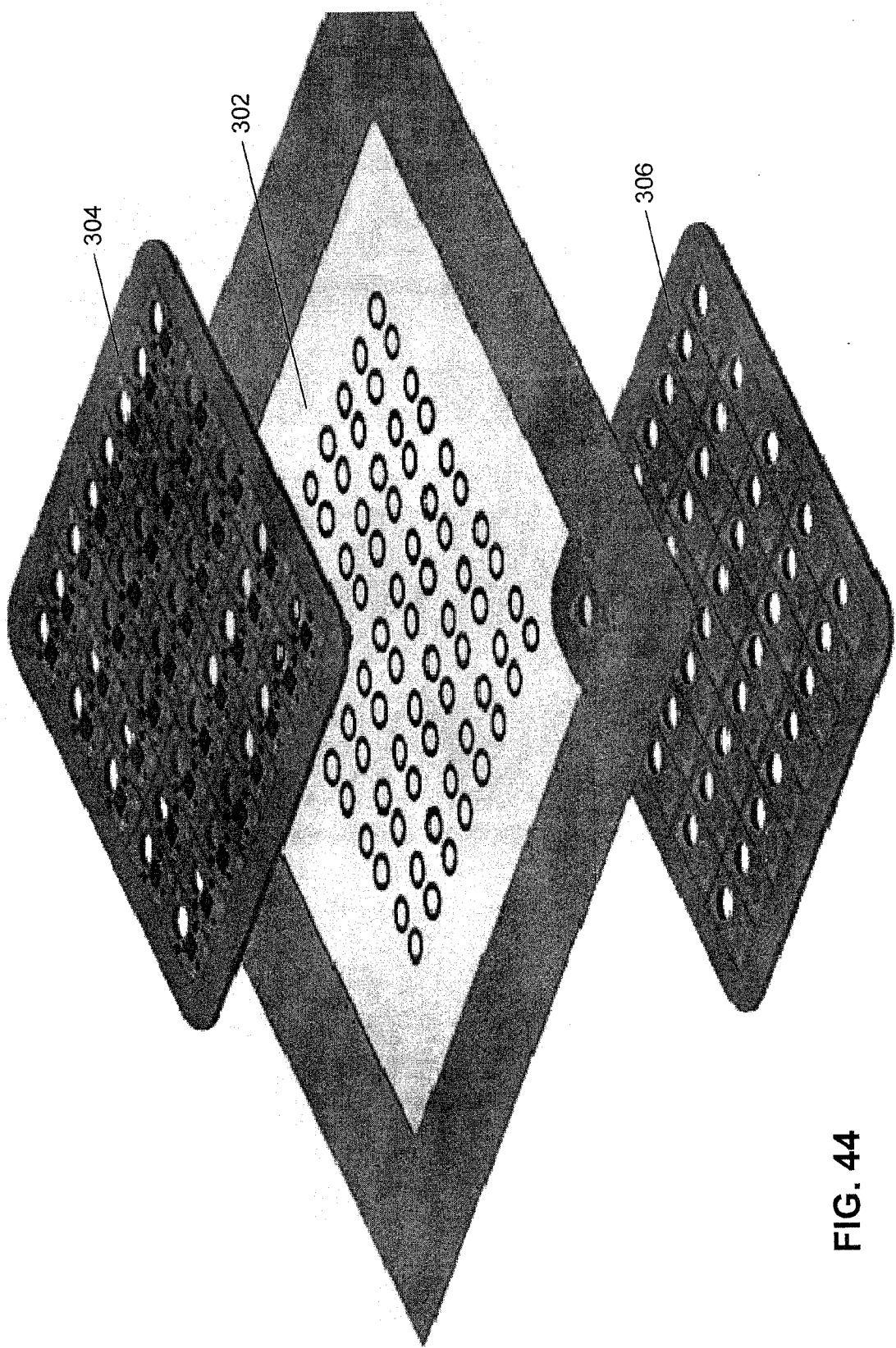
FIG. 44 is a perspective view of exemplary webs of first planar members, second planar members and a dielectric layer in accordance with aspects of the present invention.
Figure 45:
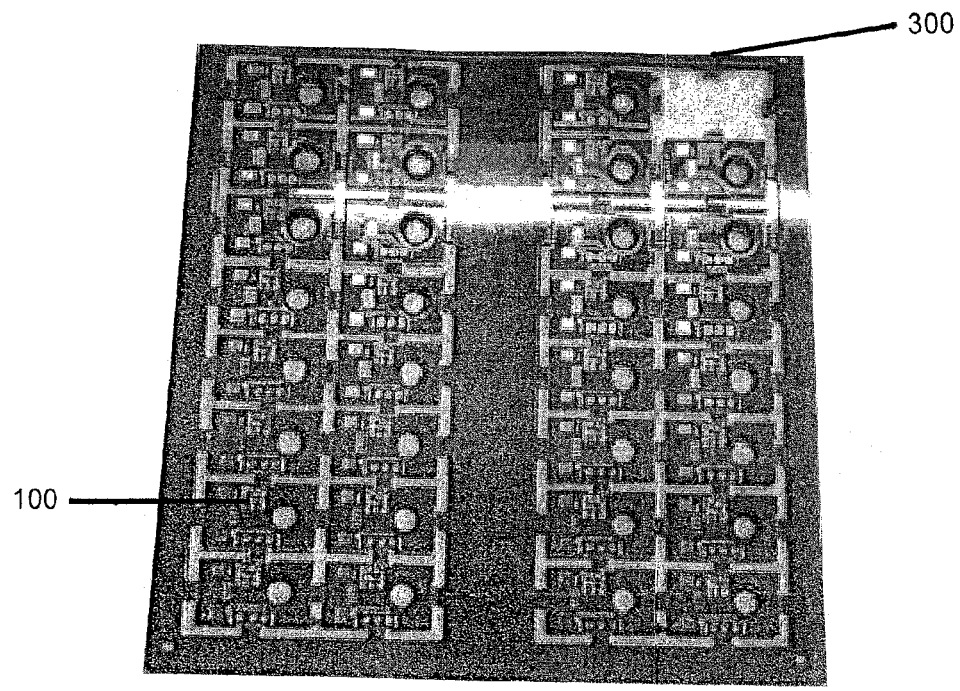
FIGS. 45-46 are exemplary illustrations of a web of sensors in accordance with aspects of the present invention.
Figure 46:
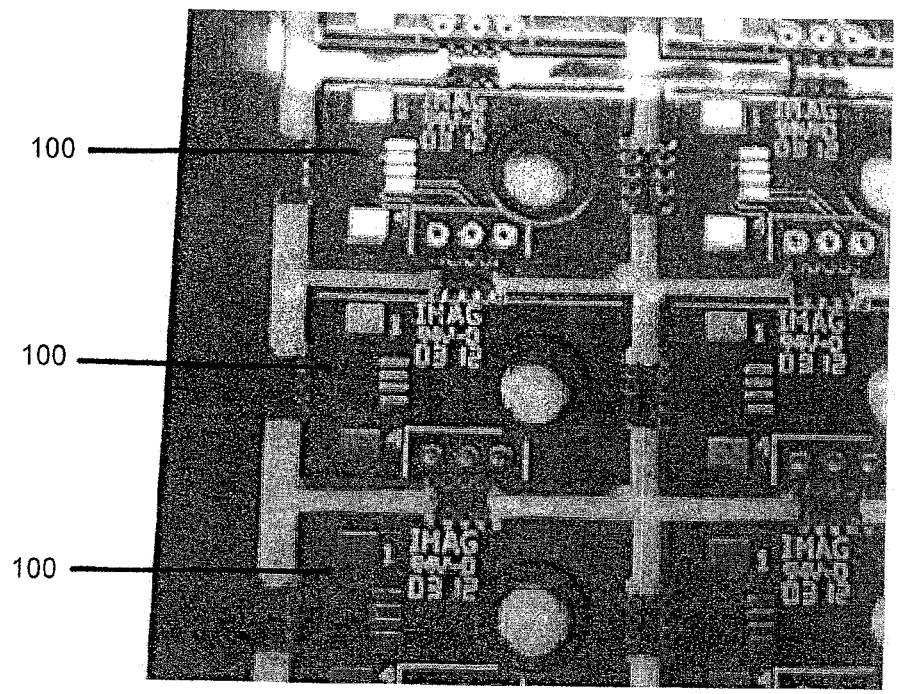

At block 285, electrical components are applied to the surface 104A of the web of first planar members 304, which results in a web of sensors 300, as illustrated in FIGS. 44-46. The web of sensors 300 may be stored in sheet form and/or each sensor 100 may be separated from the array. Each sensor 100 of the web of sensor 300 may be used in any application that the EAP cartridge 10 discussed above may be used.

Once a pressure value is determined from the sensor 100 and/or the EAP cartridge 10, the data may be stored in data storage device and/or displayed to associated user. In addition, the data may be used to monitor the fluid connector to determine a failure condition (e.g., leak in the connector, leak in the fluid transfer member coupled to the connector, etc.) and/or the data may used as a variable input to improve operating performance of the fluidic system. In addition, an alarm may be triggered to warn of an unsafe pressure detected. The alarm may be on the printed circuit board 80 or remotely located from the pressure sensor 52.

One benefit of the pressure sensor disclosed herein is the relative simplicity of the device. Currently, many fluidic and pneumatic systems do not incorporate any local pressure measurement because such devices are expensive and the complexity of commercially available pressure sensors. Aspects of the current invention allow local fluidic or pneumatic pressure measurement for many systems, which will increase the overall functionality and intelligence of these systems.

Another benefit of the pressure sensor disclosed herein involves the relative low power consumption of the EAP cartridge and supporting electronics. This allows the pressure sensor to again be used in a much wider range of applications (including wireless data transmission), due to a small coin size battery being suitable as a life-long power source.

Another benefit of the sensor 100 is an improved electrical connection between the EAP Sensing Element and electrical components (e.g., PCB logic controller). The EAP cartridge 10 utilizes a simple Flex Circuit to electrically connect between the EAP Element and electrical components (e.g., PCB logic controller), which requires in essence (8) total electrical connections. In contrast, the sensor 100 reduces the total number of electrical connections to (4) total electrical connections.

Another benefit of the sensor 100 is the simplistic nature of the mechanical assembly. Multiple components are eliminated within the Pressure Sensor assembly by directly contacting the PCB to the EAP film. For example, this eliminates the need for the Flex Circuit and overpressure protection cap, discussed above.

Another benefit of the sensor 100 is the simplistic nature of the EAP sensing element. With this style design, the EAP Silver BUS Layers and Epoxy Frame Layers discussed above with respect to EAP cartridge 10 may be eliminated, as their function can alternately be incorporated into the PCB layers. As a result, improved manufacturing throughput, cycle times and yield rates may be achieved with the simplified integrated EAP design.

Another benefit of the sensor 100 is improved handling of the sensor. With the EAP sensing element contained within the rigid planar members (e.g., PCB layers), the pressure sensor is optimized to be more rugged (less delicate).

Another benefit of the sensor 100 is the EAP sensing element output signal being more impervious to outside electrical noise factors, as the planar members (e.g., PCB layers) may incorporate grounding planes to protect against stray capacitance and EMI.

Another benefit of the sensor 100 is an overall reduction in size and mass of the pressure sensor assembly.

Another benefit of the sensor 100 is inherent mechanical isolation between the EAP active (e.g., sensing) and reference areas.

Another benefit of the sensor 100 is simplified production testing as the EAP film may be assembled between panels of multiple planar members (e.g., PCB Layers), which would be later separated into units, as discussed above.

Another benefit of the sensor 100 is the potential use of reflow soldering techniques for electronic assembly once the EAP film has been secured between the planar members (e.g., PCB layers). Due to the wide temperature range of the EAP dielectric and conductive film layers, processing temperatures of greater than 200° C. are possible.

The present invention includes a variety of other aspects:

A sensor comprising: a buffer material layer configured to at least partially deflect when a force or pressure is imparted on the buffer material layer; and an electroactive polymer (EAP) cartridge in operative contact with the buffer material layer, wherein the EAP cartridge is configured to generate an output signal that corresponds to an amount of strain imparted on the EAP cartridge.

The output signal of the EAP cartridge corresponds to the force imparted on the buffer material layer.

The output signal of the EAP cartridge is dependent on a type of material used for the buffer material layer.

The output signal of the EAP cartridge is dependent on dimensions of the of buffer material layer.

The EAP cartridge includes a first electrode layer and a second electrode layer spaced apart by a dielectric layer.

The first electrode layer and the second electrode layer are operatively coupled to a power supply to produce the output signal.

The first electrode layer and the second electrode layer are formed from a compliant conductive material.

The sensor includes a first buss layer and a second buss layer, wherein first buss layer and the second buss layer are separated by the dielectric layer, the first electrode layer and the second electrode layer. wherein at least one of the first buss layer and the second buss layer include a highly conductive material.

The first electrode layer and the second electrode layer include an active capacitive region and a reference capacitive region.

The sensor further includes a cap feature, wherein the cap feature is configured to prevent deformation of the active capacitive region over a prescribed threshold value.

The sensor further includes a first frame layer and a second frame layer, wherein the first frame layer and the second frame layers are separated by the first electrode layer, the dielectric layer, the second electrode layer, the first buss layer and the second buss layer.

The sensor includes a fluid connector having a primary fluid passageway between an inlet port and an outlet port, wherein the buffer material layer is in fluid communication with the primary fluid passageway.

The EAP cartridge is sealed from the primary fluid passageway.

The inlet port is configured to be coupled to a quick-connect coupler.

The outlet port is configured to be coupled to a fluid transfer member.

The fluid transfer member is a hose.

The sensor may include a flex circuit to provide one or more electric signals from an associated power source to at least the first electrode layer and the second electrode layer, the flex circuit may further include one or more conductors to facilitate outputting the output signal generated by the EAP cartridge to a processing device.

The sensor including a printed circuit coupled to the flex circuit, wherein the printed circuit board includes a power supply configured to provide power to the EAP cartridge.

The sensor may include a printed circuit coupled to the flex circuit, wherein the printed circuit board includes a receptacle for receiving one or more power signals from the associated power source. The receptacle may also be configured to exchange signals between the EAP cartridge and an associated processor.

The sensor may include a wireless adapter electrically coupled to the EAP cartridge, wherein the wireless adapter is configured to transmit output signals from the EAP cartridge to a remote processing device and/or storage device.

The sensor may include a fluid connector having a secondary passageway in fluid communication with the primary passageway and the buffer material layer is configured to at least partially deflect when a force or pressure is imparted on the buffer material layer through the secondary passageway.

Another aspect of the present invention includes a method for measuring fluidic pressure in a fluid connector, the method includes: positioning a buffer material layer in fluid communication between an inlet port and an outlet port of a fluid connector, wherein the fluid connector includes a primary fluid passageway for fluid transfer between the inlet port and an outlet port and the buffer material layer is configured to at least partially deflect when a force or pressure is imparted on the buffer material layer; and sensing deflection of the buffer material layer by an electroactive polymer (EAP) cartridge in operative contact with the buffer material layer, wherein the EAP cartridge is configured to generate an output signal that corresponds to an amount of strain imparted on the EAP cartridge from deflection of the buffer material layer.

The method may also include the buffer material layer being compatible with fluid entering the fluid connector through the inlet port and provides a seal sufficient to prevent the fluid from contacting the EAP cartridge.

The method may also include selecting the buffer material layer based on a desired pressure range suitable for an application in which the fluidic pressure sensor is to be used.

The method may also include selecting the buffer material layer based on a material composition of the buffer material layer suitable for use with the fluid to be used in fluid connector.

The method may also include the step of sensing deflection of the buffer material layer including comparing an active region of the EAP cartridge with a reference region of the EAP cartridge.

The method may also include wherein the EAP cartridge being mechanically isolated between the active capacitive region and the reference capacitive region.

The method may also include transmitting the output signal to a remote processing device and/or remote storage device through a wireless adapter.

The method may also include transmitting the output signal to a remote processing device and/or remote storage device through a receptacle electrically coupled to the EAP cartridge.

The method may also include, the EAP cartridge being pre-stretched over the buffer material layer to allow an immediate response to pressure variations.

The method may also include the fluid passing into the primary passageway and at least a portion of the fluid is diverted to a secondary passageway of the fluid connector and the diverted fluid imparts a force on the buffer material layer that causes the buffer material layer to deflect.

Although the principles, embodiments and operation of the present invention have been described in detail herein, this is not to be construed as being limited to the particular illustrative forms disclosed. They will thus become apparent to those skilled in the art that various modifications of the embodiments herein can be made without departing from the spirit or scope of the invention.

What is claimed is:

1. A sensor comprising:
   a buffer material layer configured to at least partially deflect when a force or pressure is imparted on the buffer material layer; and
   an electroactive polymer (EAP) cartridge in operative contact with the buffer material layer, wherein the EAP cartridge is configured to generate an output signal that corresponds to an amount of strain imparted on the EAP cartridge.

2. The sensor of claim 1, wherein the output signal of the EAP cartridge corresponds to the force or pressure imparted on the buffer material layer.

3. The sensor of claim 1, wherein the output signal of the EAP cartridge is dependent on a type of material used and/or dimension of the buffer material layer.

4. The sensor of claim 1, wherein the EAP cartridge includes a first electrode layer and a second electrode layer spaced apart by a dielectric layer.

5. The sensor of claim 1, wherein the first electrode layer and the second electrode layer are operatively coupled to a power supply to produce the output signal.

6. The sensor of claim 5, wherein the first electrode layer and the second electrode layer are formed from a compliant conductive material.

7. The sensor of claim 6, wherein the first electrode layer and the second electrode layer include an active capacitive region and a reference capacitive region.

8. The sensor of claim 7 further including a cap feature, wherein the cap feature is configured to prevent deformation of the active capacitive region over a prescribed threshold value.

9. The sensor of claim 1, further including a fluid connector having a primary fluid passageway between an inlet port and an outlet port, wherein the buffer material layer is in fluid communication with the primary fluid passageway.

10. The sensor of claim 9, wherein the EAP cartridge is sealed from the primary fluid passageway.

11. The sensor of claim 9, wherein the inlet port is configured to be coupled to a quick-connect coupler.

12. The sensor of claim 9, wherein the fluid connector includes a secondary passageway in fluid communication with the primary passageway and the buffer material layer is configured to at least partially deflect when a force or pressure is imparted on the buffer material layer through the secondary passageway.

13. The sensor of claim 1 further including a first frame layer and a second frame layer, wherein the first frame layer and the second frame layers are separated by the first electrode layer, the dielectric layer, the second electrode layer.

14. The sensor of claim 13 further including one or more ventilation openings formed through at least one of the first frame layer and the second frame layer.

15. A method for measuring fluidic pressure in a fluid connector, the method comprising:
  positioning a buffer material layer in fluid communication between an inlet port and an outlet port of a fluid connector, wherein the fluid connector includes a primary fluid passageway for fluid transfer between the inlet port and an outlet port and the buffer material layer is configured to at least partially deflect when a force or pressure is imparted on the buffer material layer; and
  sensing deflection of the buffer material layer by an electroactive polymer (EAP) cartridge in operative contact with the buffer material layer, wherein the EAP cartridge is configured to generate an output signal that corresponds to an amount of strain imparted on the EAP cartridge from deflection of the buffer material layer.

16. The method of claim 15, wherein the step of sensing deflection of the buffer material layer includes comparing an active region of the EAP cartridge with a reference region of the EAP cartridge.

17. The method of claim 15, wherein the EAP cartridge is mechanically isolated between the active capacitive region and the reference capacitive region.

18. The method of claim 15 further including transmitting the output signal to a remote processing device and/or remote storage device through a wireless adapter and/or a wired adapter.

19. The method of claim 15, wherein the EAP cartridge is pre-stretched over the buffer material layer to allow an immediate response to pressure variations.

20. The method of claim 15, wherein the fluid passes into the primary passageway and at least a portion of the fluid is diverted to a secondary passageway of the fluid connector and the diverted fluid imparts a force or pressure on the buffer material layer that causes the buffer material layer to deflect.

21. A fluid connector comprising:
  a body having a primary fluid passageway defined between an inlet port and an outlet port;
  a buffer material layer configured to at least partially deflect when a force or pressure is imparted on the buffer material layer by fluid entering the primary fluid passageway; and
  an electroactive polymer (EAP) cartridge in operative contact with the buffer material layer, wherein the EAP cartridge is configured to generate an output signal that corresponds to an amount of strain imparted on the EAP cartridge by the deflection of the buffer material layer on the EAP cartridge.

22. The fluid connector of claim 21, wherein the EAP cartridge includes a first electrode layer and a second electrode layer spaced apart by a dielectric layer.

23. The fluid connector of claim 22, wherein the first electrode layer and the second electrode layer are operatively coupled to a power supply to produce the output signal.

24. The fluid connector of claim 23, wherein the first electrode layer and the second electrode layer are formed from a compliant conductive material.

25. The fluid connector of claim 24, wherein the EAP cartridge further includes a first buss layer and a second buss layer, wherein first buss layer and the second buss layer are separated by the dielectric layer, the first electrode layer and the second electrode layer.

26. The fluid connector of claim 25, wherein the first buss layer and the second buss layer include an active capacitive region and a reference capacitive region.

27. The fluid connector of claim 26, wherein the EAP cartridge further includes a first frame layer and a second frame layer, wherein the first frame layer and the second frame layers are separated by the first electrode layer, the dielectric layer, the second electrode layer, the first buss layer and the second buss layer.

* * * * *